US007897213B2

(12) United States Patent
Mikhaylichenko et al.

(10) Patent No.: US 7,897,213 B2
(45) Date of Patent: Mar. 1, 2011

(54) METHODS FOR CONTAINED CHEMICAL SURFACE TREATMENT

(75) Inventors: Katrina Mikhaylichenko, San Jose, CA (US); Mike Ravkin, Sunnyvale, CA (US); Fritz Redeker, Fremont, CA (US); John M. de Larios, Palo Alto, CA (US); Erik M. Freer, Campbell, CA (US); Mikhail Korolik, San Jose, CA (US)

(73) Assignee: LAM Research Corporation, Fremont, CA (US)

( * ) Notice: Subject to any disclaimer, the term of this patent is extended or adjusted under 35 U.S.C. 154(b) by 990 days.

(21) Appl. No.: 11/704,435

(22) Filed: Feb. 8, 2007

(65) Prior Publication Data

US 2009/0114249 A1    May 7, 2009

(51) Int. Cl.
*B05D 5/00*    (2006.01)
(52) U.S. Cl. .......................... 427/256; 427/134; 34/79; 34/310; 34/351; 34/381; 118/317; 118/400; 134/2; 134/6; 134/7; 134/10
(58) Field of Classification Search ................. 427/134, 427/256; 34/79, 310, 351, 381; 118/317; 118/400; 134/2, 6, 7, 10
See application file for complete search history.

(56) References Cited

U.S. PATENT DOCUMENTS 3,037,887 A    6/1962    Brenner et al. ................. 134/22

(Continued)

FOREIGN PATENT DOCUMENTS

DE    40-38-587    6/1992

(Continued)

OTHER PUBLICATIONS

PCT International Search Report—PCT US2008/001010 (3 pages) Dated Jun. 24, 2008.

(Continued)

*Primary Examiner*—Michael Kornakov
*Assistant Examiner*—Xiao Zhao
(74) *Attorney, Agent, or Firm*—Martine Penilla & Gencarella, LLP

(57) ABSTRACT

An apparatus, system and method for preparing a surface of a substrate using a proximity head includes applying a non-Newtonian fluid between the surface of the substrate and a head surface of the proximity head. The non-Newtonian fluid defines a containment wall along one or more sides between the head surface and the surface of the substrate. The one or more sides provided with the non-Newtonian fluid define a treatment region on the substrate between the head surface and the surface of the substrate. A Newtonian fluid is applied to the surface of the substrate through the proximity head, such that the applied Newtonian fluid is substantially contained in the treatment region defined by the containment wall. The contained Newtonian fluid aids in the removal of one or more contaminants from the surface of the substrate. In one example, the non-Newtonian fluid can also be used to create ambient controlled isolated regions, which can assist in controlled processing of surfaces within the regions. In an alternate example, a second non-Newtonian fluid is applied to the treatment region instead of the Newtonian fluid. The second non-Newtonian fluid acts on one or more contaminants on the surface of the substrate substantially removing them from the surface of the substrate.

22 Claims, 9 Drawing Sheets

U.S. PATENT DOCUMENTS

| | | | |
|---|---|---|---|
| 3,212,762 A | 10/1965 | Carroll et al. | 261/124 |
| 3,436,262 A | 4/1969 | Crowe et al. | 134/10 |
| 3,617,095 A | 11/1971 | Lissant | 406/197 |
| 3,978,176 A | 8/1976 | Voegeli | 261/122 |
| 4,085,059 A | 4/1978 | Smith et al. | 134/26 |
| 4,133,773 A | 1/1979 | Simmons | 261/21 |
| 4,156,619 A | 5/1979 | Griesshammer | 134/2 |
| 4,238,244 A | 12/1980 | Banks | 134/22 |
| 4,781,764 A | 11/1988 | Leenaars | 134/34 |
| 4,817,652 A | 4/1989 | Liu et al. | 134/102 |
| 4,838,289 A | 6/1989 | Kottman et al. | 134/153 |
| 4,849,027 A | 7/1989 | Simmons | 134/22 |
| 4,911,761 A | 3/1990 | McConnell et al. | 134/11 |
| 4,962,776 A | 10/1990 | Liu et al. | 134/11 |
| 5,000,795 A | 3/1991 | Chung et al. | 134/37 |
| 5,048,549 A | 9/1991 | Hethcoat | 134/122 R |
| 5,102,777 A | 4/1992 | Lin et al. | 510/176 |
| 5,105,556 A | 4/1992 | Kurokawa et al. | 34/470 |
| 5,113,597 A | 5/1992 | Sylla | 34/443 |
| 5,175,124 A | 12/1992 | Winebarger | 438/584 |
| 5,181,985 A | 1/1993 | Lampert et al. | 438/748 |
| 5,226,969 A | 7/1993 | Watanabe et al. | 134/7 |
| 5,242,669 A | 9/1993 | Flor | 423/465 |
| 5,271,774 A | 12/1993 | Leenaars et al. | 134/31 |
| 5,288,332 A | 2/1994 | Pustilnik et al. | 134/27 |
| 5,306,350 A | 4/1994 | Hoy et al. | 134/22.14 |
| 5,336,371 A | 8/1994 | Chung et al. | 134/34 |
| 5,415,191 A | 5/1995 | Mashimo et al. | 134/102.1 |
| 5,417,768 A | 5/1995 | Smith et al. | 134/10 |
| 5,464,480 A | 11/1995 | Matthews | 134/1.3 |
| 5,472,502 A | 12/1995 | Batchelder | 118/52 |
| 5,494,526 A | 2/1996 | Paranjpe | 134/1 |
| 5,498,293 A | 3/1996 | Ilardi et al. | 134/3 |
| 5,656,097 A | 8/1997 | Olesen et al. | 134/1 |
| 5,660,642 A | 8/1997 | Britten | 134/30 |
| 5,705,223 A | 1/1998 | Bunkofske | 427/240 |
| 5,800,626 A | 9/1998 | Cohen et al. | 134/1.3 |
| 5,858,283 A | 1/1999 | Burris | 261/122.1 |
| 5,900,191 A | 5/1999 | Gray et al. | 261/59 |
| 5,904,156 A | 5/1999 | Advocate, Jr. et al. | 134/2 |
| 5,908,509 A | 6/1999 | Olesen et al. | 134/1.3 |
| 5,911,837 A | 6/1999 | Matthews | 134/2 |
| 5,932,493 A | 8/1999 | Akatsu et al. | 438/745 |
| 5,944,581 A | 8/1999 | Goenka | 451/39 |
| 5,944,582 A | 8/1999 | Talieh | 451/41 |
| 5,945,351 A | 8/1999 | Mathuni | 438/706 |
| 5,951,779 A | 9/1999 | Koyanagi et al. | 134/2 |
| 5,964,954 A | 10/1999 | Matsukawa et al. | 134/6 |
| 5,964,958 A | 10/1999 | Ferrell et al. | 134/26 |
| 5,968,285 A | 10/1999 | Ferrell et al. | 134/26 |
| 5,997,653 A | 12/1999 | Yamasaka | 134/2 |
| 6,048,409 A | 4/2000 | Kanno et al. | 134/34 |
| 6,049,996 A | 4/2000 | Freeman et al. | 34/362 |
| 6,081,650 A | 6/2000 | Lyons et al. | 386/95 |
| 6,090,217 A | 7/2000 | Kittle | 134/11 |
| 6,092,538 A | 7/2000 | Arai et al. | 134/1.3 |
| 6,152,805 A | 11/2000 | Takahashi | 451/36 |
| 6,158,445 A | 12/2000 | Olesen et al. | 134/1.3 |
| 6,167,583 B1 | 1/2001 | Miyashita et al. | 15/77 |
| 6,228,563 B1 | 5/2001 | Starov et al. | 430/327 |
| 6,267,125 B1 | 7/2001 | Bergman et al. | 134/102.1 |
| 6,270,584 B1 | 8/2001 | Ferrell et al. | 134/26 |
| 6,272,712 B1 | 8/2001 | Gockel et al. | 15/77 |
| 6,276,459 B1 | 8/2001 | Herrick et al. | 169/14 |
| 6,286,231 B1 | 9/2001 | Bergman et al. | 34/410 |
| 6,290,780 B1 | 9/2001 | Ravkin | 134/6 |
| 6,296,715 B1 | 10/2001 | Kittle | 134/2 |
| 6,319,801 B1 | 11/2001 | Wake et al. | 438/585 |
| 6,352,082 B1 | 3/2002 | Mohindra et al. | 134/25.4 |
| 6,386,956 B1 | 5/2002 | Sato et al. | 451/57 |
| 6,398,975 B1 | 6/2002 | Mertens et al. | 216/92 |
| 6,401,734 B1 | 6/2002 | Morita et al. | 134/153 |
| 6,423,148 B1 | 7/2002 | Aoki | 134/3 |
| 6,439,247 B1 | 8/2002 | Kittle | 134/102.1 |
| 6,457,199 B1 | 10/2002 | Frost et al. | 15/77 |
| 6,491,043 B2 | 12/2002 | Mohindra et al. | 134/25.4 |
| 6,491,764 B2 | 12/2002 | Mertens et al. | 134/36 |
| 6,493,902 B2 | 12/2002 | Lin | 15/302 |
| 6,513,538 B2 | 2/2003 | Chung et al. | 134/1.2 |
| 6,514,921 B1 | 2/2003 | Kakizawa | 510/175 |
| 6,527,870 B2 | 3/2003 | Gotkis | 134/6 |
| 6,532,976 B1 | 3/2003 | Huh et al. | 134/111 |
| 6,537,915 B2 | 3/2003 | Moore et al. | 438/692 |
| 6,562,726 B1 | 5/2003 | Torek et al. | 438/745 |
| 6,576,066 B1 | 6/2003 | Namatsu | 134/30 |
| 6,594,847 B1 | 7/2003 | Krusell et al. | 15/102 |
| 6,616,772 B2 | 9/2003 | de Larios et al. | 134/21 |
| 6,733,596 B1 | 5/2004 | Mikhaylichenko et al. | 134/6 |
| 6,787,473 B2 | 9/2004 | Andreas | 438/692 |
| 6,797,071 B2 | 9/2004 | Kittle | 134/11 |
| 6,802,911 B2 | 10/2004 | Lee et al. | 134/28 |
| 6,846,380 B2 | 1/2005 | Dickinson et al. | 156/345.31 |
| 6,851,435 B2 | 2/2005 | Mertens et al. | 134/99.1 |
| 6,874,516 B2 | 4/2005 | Matsuno et al. | 134/148 |
| 6,896,826 B2 | 5/2005 | Wojtczak et al. | 252/79.1 |
| 6,927,176 B2 | 8/2005 | Verhaverbeke et al. | 438/745 |
| 6,946,396 B2 | 9/2005 | Miyazawa et al. | 438/689 |
| 6,951,042 B1 | 10/2005 | Mikhaylichenko et al. | 15/77 |
| 6,988,326 B2 | 1/2006 | O'Donnell et al. | |
| 7,122,126 B1 | 10/2006 | Fuentes | 216/90 |
| 2002/0072482 A1 | 6/2002 | Sachdev et al. | 510/175 |
| 2002/0094684 A1 | 7/2002 | Hirasaki et al. | 438/689 |
| 2002/0121290 A1 | 9/2002 | Tang et al. | 134/6 |
| 2002/0185164 A1 | 12/2002 | Tetsuka et al. | 134/148 |
| 2002/0195121 A1 | 12/2002 | Kittle | 134/3 |
| 2003/0075204 A1 | 4/2003 | de Larios et al. | 134/21 |
| 2003/0148903 A1 | 8/2003 | Bargaje et al. | 510/130 |
| 2003/0171239 A1 | 9/2003 | Patel et al. | 510/406 |
| 2003/0226577 A1 | 12/2003 | Orll et al. | 134/1.3 |
| 2004/0002430 A1 | 1/2004 | Verhaverbeke | 510/175 |
| 2004/0053808 A1 | 3/2004 | Raehse et al. | 510/447 |
| 2004/0134515 A1 | 7/2004 | Castrucci | 134/2 |
| 2004/0159335 A1 | 8/2004 | Montierth et al. | 134/10 |
| 2004/0163681 A1 | 8/2004 | Verhaverbeke | 134/28 |
| 2004/0261823 A1 | 12/2004 | de Larios | 134/31 |
| 2005/0045209 A1 | 3/2005 | Tan | 134/18 |
| 2005/0132515 A1 | 6/2005 | Boyd et al. | 15/77 |
| 2005/0133060 A1 | 6/2005 | de Larios et al. | 134/1.3 |
| 2005/0133061 A1 | 6/2005 | de Larios et al. | 134/6 |
| 2005/0159322 A1 | 7/2005 | Min et al. | 510/175 |
| 2005/0176606 A1 | 8/2005 | Konno et al. | 510/175 |
| 2005/0183740 A1 | 8/2005 | Fulton et al. | 134/3 |
| 2006/0201267 A1 | 9/2006 | Liu | 74/89.2 |
| 2006/0283486 A1 | 12/2006 | de Larios et al. | |
| 2006/0285930 A1 | 12/2006 | de Larios et al. | 406/197 |
| 2007/0000518 A1 | 1/2007 | Korolik et al. | 134/21 |

FOREIGN PATENT DOCUMENTS

| | | | |
|---|---|---|---|
| EP | 0827188 | 3/1998 | |
| EP | 0905746 | 3/1999 | |
| EP | 11-334874 | 12/1999 | |
| EP | 0989600 | 3/2000 | |
| JP | 53-076559 | 7/1978 | |
| JP | 56-084618 | 7/1981 | |
| JP | 56-084619 | 7/1981 | |
| JP | 59-24849 | 2/1984 | 205/704 |
| JP | 60-005529 | 1/1985 | |
| JP | 62-119543 | 5/1987 | |
| JP | 63-077510 | 4/1988 | |
| JP | 02-309638 A | 12/1990 | |
| JP | 5-15857 | 1/1993 | |
| JP | 06-177101 | 6/1994 | |
| JP | 07-006993 | 1/1995 | |

| | | |
|---|---|---|
| JP | 11-350169 | 12/1999 |
| JP | 2001-064688 | 3/2001 |
| JP | 2002-66475 A | 3/2002 |
| JP | 2002-280330 | 9/2002 |
| JP | 2002-309638 | 10/2002 |
| JP | 2003-151948 A | 5/2003 |
| JP | 2003-282513 | 10/2003 |
| JP | 2005-194294 | 7/2005 |
| WO | WO-99/16109 | 4/1999 |
| WO | WO-00/33980 | 6/2000 |
| WO | WO-00/59006 | 10/2000 |
| WO | WO-01/12384 | 2/2001 |
| WO | WO-02/101795 | 12/2002 |
| WO | WO-2005/006424 | 1/2005 |
| WO | WO 2005/064647 | 7/2005 |

OTHER PUBLICATIONS

Aubert, JM et al.; "Aqueous foams"; Scientific American; 1986, 74-82.

Kittle, et al.; "Semiconductor Wafer Cleaning and Drying Using a Foam Medium"; <http://www.aquafoam.com/papers;SCI0202.pdf>; Sematech Novel Wafer Cleans Working Group Meeting, Internet Presentation; Nov. 13, 2001.

Hunter; "Introduction to Modern Colloid Science"; Oxford University Press; Feb. 1, 1994.

Lester; "Is Foam Wafer Cleaning and Drying the Future?" <http://www.aquafoam.com/papers/SCI0202.pdfaa>; Semiconductor International, 25, #2; Feb. 1, 2002.

Kirkpatrick et al.; "Advanced Wafer-Cleaning Evolution"; Solid State Technology; May 2003; www.solid-state.com.

Weaire et al.; "The Physics of Foams"; Department of Physics; Trinity Collogue, Dublin; 1999.

Kittle, et al.; "Photoresist Residue Removal Using Aqueous Foam Proof of Concept Experiments"; Internet; http://www.aquafoam.com/paper/Proof-11MB.pdf;<papers/A2C2photoresist.pdf>; 13-17; May 1, 2002.

Lide; "Air Composition"; CRC Handbook of Chemistry and Physics; 1997.

U.S. Appl. No. 11/639,752, filed Dec. 15, 2006, Boyd et al.

U.S. Appl. No. 11/743,283, filed May 2, 2007, Freer et al.

METHODS FOR CONTAINED CHEMICAL SURFACE TREATMENT

CROSS REFERENCE TO RELATED APPLICATIONS

This application is related to U.S. patent application Ser. No. 10/608,871, filed Jun. 27, 2003, and entitled "Method and Apparatus for Removing a Target Layer from a Substrate Using Reactive Gases"; U.S. patent application Ser. No. 10/746,114, filed on Dec. 23, 2003, and entitled "Method and Apparatus for Cleaning Semiconductor Wafers using Compressed and/or Pressurized Foams, Bubbles, and/or Liquids"; U.S. patent application Ser. No. 11/532,491, filed on Sep. 15, 2006, and entitled "Method and Material for cleaning a substrate"; U.S. patent application Ser. No. 11/532,493, filed on Sep. 15, 2006, and entitled "Apparatus and System for cleaning a substrate". The disclosure of each of these related applications is incorporated herein by reference for all purposes.

FIELD OF THE INVENTION

The present invention relates generally to semiconductor substrate processing, and more particularly, to systems and methods for a contained chemical surface treatment to remove particles from a surface of a semiconductor substrate during fabrication operations.

DESCRIPTION OF THE RELATED ART

During a substrate manufacturing process, a surface of a substrate is continuously exposed to various chemicals. The chemicals used in the various manufacturing process operations may be a source for one or more contaminants that form on the surface of the substrate. These contaminants deposit on the surface of the substrate as particulates and may likely cause damage to the devices and features within the vicinity of the contaminant particles. It is, therefore, necessary to eliminate the contaminants from the surface of the substrate in a timely and efficient manner without damaging features and devices.

Conventional substrate cleaning methods have relied on either mechanical force or chemicals to remove particulate contamination from the substrate surface. As devices and feature sizes continue to decrease in size and they become more fragile, the mechanical force applied in the cleaning methods increase the likelihood of causing damage to these features and devices. Using chemicals to remove contamination has proven another challenge The application and removal of the chemicals cause uncontrolled de-wetting (among other problems) that leads to creation of watermarks and other defects on the surface. In addition, the conventional cleaning methods have been unable to provide a substantially oxygen-free or low oxygen environment in a treatment region during the cleaning operation. The presence of oxygen in the treatment region during cleaning may cause oxidation of copper and other metals used in forming the features at the treatment region, such as interconnects, rendering the features and devices connected by these interconnects inoperable. Thus, efficient and non-damaging removal of contaminants during fabrication represents a continuing challenge.

In view of the foregoing, a more effective and less abrasive cleaning technology is needed in removing the contaminants from the surface of the substrate.

SUMMARY

The present invention fills the need by providing improved methods and apparatus for efficiently removing a contaminant from the surface of the substrate. It should be appreciated that the present invention can be implemented in numerous ways, including an apparatus and a method. Several inventive embodiments of the present invention are described below.

In one embodiment, a method for preparing a surface of a substrate using a proximity head is disclosed. The method includes applying a non-Newtonian fluid between the surface of the substrate and a head surface of the proximity head. The non-Newtonian fluid defines a containment wall along one or more sides between the head surface and the surface of the substrate. The one or more sides provided with the non-Newtonian fluid defines a treatment region on the substrate between the head surface and the surface of the substrate. A Newtonian fluid is applied to the surface of the substrate through the proximity head, such that the applied Newtonian fluid is substantially contained in the treatment region defined by the containment wall. The Newtonian fluid aids in the substantial removal of one or more contaminants from the surface of the substrate.

In another embodiment, a method for preparing a surface of a substrate using a proximity head is disclosed. The method includes applying a first non-Newtonian fluid between the surface of the substrate and a head surface of the proximity head. The first non-Newtonian fluid defines a containment wall along one or more sides between the head surface and the surface of the substrate. The one or more sides provided with the first non-Newtonian fluid defines a treatment region on the substrate between the head surface and the surface of the substrate. A second non-Newtonian fluid, that is different from the first non-Newtonian fluid, is applied to the surface of the substrate through the proximity head, such that the applied second non-Newtonian fluid is substantially contained in the treatment region defined by the containment wall. The second non-Newtonian fluid aids in the substantial removal of one or more contaminants from the surface of the substrate.

In another embodiment, a method for preparing a surface of a substrate using a proximity head is disclosed. The method includes applying a non-Newtonian fluid between the surface of the substrate and a head surface of the proximity head. The non-Newtonian fluid defines a containment wall along one or more sides between the head surface and the surface of the substrate. The one or more sides provided with the non-Newtonian fluid define a treatment region on the substrate between the head surface and the surface of the substrate. A first Newtonian fluid is applied to the surface of the substrate through the proximity head, such that the applied first Newtonian fluid is substantially contained within a first sub-region in the treatment region defined by the containment wall. A second Newtonian fluid, that is different from the first Newtonian fluid, is applied to the surface of the substrate through the proximity head, such that the applied second Newtonian fluid is substantially contained within a second sub-region in the treatment region defined by the containment wall. The first and the second Newtonian fluids act on one or more contaminants formed at the surface of the substrate covered by the treatment region and substantially removes them.

In an alternate embodiment, a first non-Newtonian fluid is applied between the surface of the substrate and a head surface of the proximity head so as to form a containment wall defining a treatment region, a second and third non-Newtonian fluids are applied within a first and second sub-region within the treatment region. The second and the third non-Newtonian fluids differ from each other and from the first non-Newtonian fluid. The second and the third non-Newtonian fluids act on one or more contaminants formed at the surface of the substrate covered by the treatment region and substantially removes the contaminants.

In an alternate embodiment, a first non-Newtonian fluid is applied between the surface of the substrate and a head surface of the proximity head so as to form a containment wall defining a treatment region. A second non-Newtonian fluid and a Newtonian fluid are applied to the surface of the substrate such that the second non-Newtonian fluid and the Newtonian fluid are substantially contained within a first and second sub-region within the treatment region. The Newtonian fluid and the second non-Newtonian fluid within the treatment region act on one or more contaminants formed at the surface of the substrate covered by the treatment region and substantially removes the contaminants.

In another embodiment, a method for preparing a surface of a substrate using a proximity head is disclosed. The method includes applying a non-Newtonian fluid between the surface of the substrate and a head surface of the proximity head. The non-Newtonian fluid defines a containment wall along one or more sides between the head surface and the surface of the substrate. The one or more sides provided with the non-Newtonian fluid define a treatment region on the substrate between the head surface and the surface of the substrate, that is substantially isolated from external uncontrolled ambient conditions by the containment wall. An inert gas is applied to the treatment region through the proximity head, such that the applied inert gas occupies the treatment region substantially displacing existing gas and chemicals, the inert gas application in the treatment region providing a substantially low-oxygen or an oxygen-free environment in the treatment region to facilitate additional fabrication.

In yet another embodiment, an apparatus for preparing a surface of a substrate using a proximity head is disclosed. The apparatus includes a substrate supporting device to receive and hold the substrate along a plane and a proximity head to supply a non-Newtonian fluid and a Newtonian fluid. The proximity head includes a non-Newtonian fluid applicator to apply a non-Newtonian fluid between the surface of the substrate and a head surface of the proximity head. The applied non-Newtonian fluid defines a containment wall along one or more sides between the head surface and the surface of the substrate. The one or more sides provided with the non-Newtonian fluid defines a treatment region on the substrate between the head surface and the surface of the substrate. The proximity head further includes a Newtonian fluid applicator to apply a Newtonian fluid to the surface of the substrate, such that the applied Newtonian fluid is substantially contained in the treatment region due to the defined containment wall. The Newtonian fluid acts on the contaminant formed at the surface of the substrate covered by the treatment region and removes them.

In an alternate embodiment of the apparatus described above, a second non-Newtonian fluid applicator is used to apply a second non-Newtonian fluid to the treatment region defined by the containment walls. The second non-Newtonian fluid is substantially contained within the treatment region and acts on the contaminant formed at the surface of the substrate substantially removing them.

Other aspects and advantages of the invention will become more apparent from the following detailed description, taken in conjunction with the accompanying drawings, illustrating by way of example the present invention.

BRIEF DESCRIPTION OF THE DRAWINGS

The invention may best be understood by reference to the following description taken in conjunction with the accompanying drawings. These drawings should not be taken to limit the invention to the preferred embodiments, but are for explanation and understanding only.

DETAILED DESCRIPTION

Figure 1:
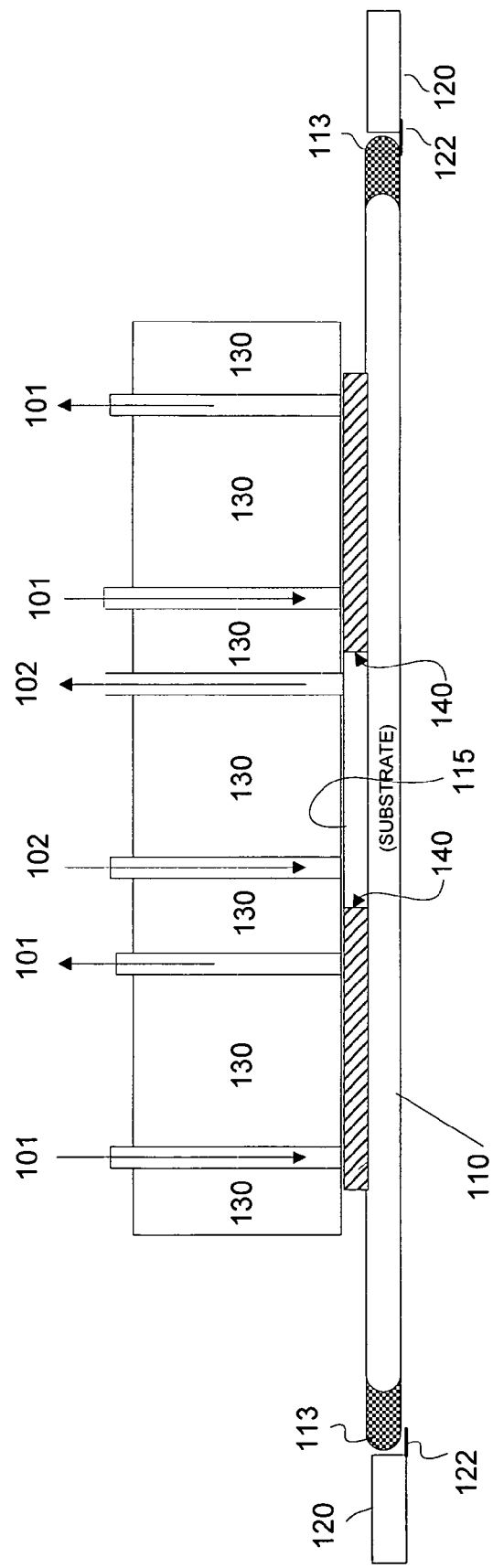
FIG. 1 is a simplified block diagram illustrating a proximity head applying a non-Newtonian fluid and a Newtonian fluid, in one embodiment of the invention.

Several embodiments for effectively removing the contaminants from a surface of a substrate will now be described. It will be obvious, however, to one skilled in the art, that the present invention may be practiced without some or all of these specific details. In other instances, well known process operations have not been described in detail in order not to unnecessarily obscure the present invention.

Effective removal of contaminants from the surface of a substrate is important to preserve the quality and functionality of the features formed on the substrate and the resulting semiconductor products, e.g., microchips. In one embodiment of the invention, the contaminants are removed by applying a Newtonian fluid, typically a cleaning chemistry, DI water, or mixtures of fluids to the surface of the substrate using a proximity head. As described herein, a Newtonian fluid is a fluid in which the viscosity depends on temperature and pressure (and chemical composition) and not on the shear stress acting upon it. A Newtonian fluid adheres to the definition of Newton's Law of viscosity.

For additional information about Non-Newtonian and Newtonian fluids, reference can be made to U.S. application Ser. No. 11/174,080, filed on Jun. 30, 2005 and entitled "METHOD FOR REMOVING MATERIAL FROM SEMICONDUCTOR WAFER AND APPARATUS FOR PERFORMING THE SAME." This patent application, which is assigned to Lam Research Corporation, the assignee of the subject application, is incorporated herein by reference.

As described herein, a proximity head is a substrate treatment apparatus that can deliver precise volumes of a fluid to a surface of a substrate to be treated, and remove the fluid from the surface, when the proximity head is placed in close relation to the surface of the substrate. In one example, the proximity head has a head surface and the head surface is placed substantially parallel to the surface of the substrate. A meniscus is formed between the head surface and the surface of the substrate. The proximity head may also be configured to deliver a plurality of fluids and are configured with vacuum ports for removing the plurality of fluids that were delivered.

A "meniscus", as used herein, refers to a volume of chemistry bounded and contained in part by surface tension of the chemistry between the head surface of a proximity head and a surface of the substrate. The meniscus thus formed, may be moved over the surface in the contained shape and is used to remove the contaminants, particulates or unwanted materials from the surface of the substrate. Furthermore, the meniscus shape can be controlled by precision fluid delivery and removal systems that may further include a computing system. For more information on the formation of a meniscus and the application to the surface of a substrate, reference may be made to: (1) U.S. Pat. No. 6,616,772, issued on Sep. 9, 2003 and entitled "METHODS FOR WAFER PROXIMITY CLEANING AND DRYING,"; (2) U.S. patent application Ser. No. 10/330,843, filed on Dec. 24, 2002 and entitled "MENISCUS, VACUUM, IPA VAPOR, DRYING MANIFOLD," (3) U.S. Pat. No. 6,988,327, issued on Jan. 24, 2005 and entitled "METHODS AND SYSTEMS FOR PROCESSING A SUBSTRATE USING A DYNAMIC LIQUID MENISCUS," (4) U.S. Pat. No. 6,988,326, issued on Jan. 24, 2005 and entitled "PHOBIC BARRIER MENISCUS SEPARATION AND CONTAINMENT," and (5) U.S. Pat. No. 6,488,040, issued on Dec. 3, 2002 and entitled "CAPILLARY PROXIMITY HEADS FOR SINGLE WAFER CLEANING AND DRYING," each is assigned to Lam Research Corporation, the assignee of the subject application, and each is incorporated herein by reference.

By controlling the delivery and removal of the fluids to the meniscus, the meniscus can be controlled and moved over the surface of the substrate. In some embodiments, the substrate can be moved, while the proximity head is still, and in other embodiments, the proximity head moves and the substrate remains still, during the processing period. Further, for completeness, it should be understood that the processing can occur in any orientation, and as such, the meniscus can be applied to surfaces that are not horizontal (e.g., vertical substrates or substrates that are held at an angle).

For additional information with respect to the proximity head, reference can be made to an exemplary proximity head, as described in the U.S. Pat. No. 6,616,772, issued on Sep. 9, 2003 and entitled "METHODS FOR WAFER PROXIMITY CLEANING AND DRYING." This U.S. patent application, which is assigned to Lam Research Corporation, the assignee of the subject application, is incorporated herein by reference.

For additional information about top and bottom menisci, reference can be made to the exemplary meniscus, as disclosed in U.S. patent application Ser. No. 10/330,843, filed on Dec. 24, 2002 and entitled "MENISCUS, VACUUM, IPA VAPOR, DRYING MANIFOLD. " This U.S. patent application, which is assigned to Lam Research Corporation, the assignee of the subject application, is incorporated herein by reference.

In one embodiment, a proximity head is first used to apply a non-Newtonian fluid between the surface of the substrate and a head surface of the proximity head. As described herein, a non-Newtonian fluid is a fluid in which the viscosity changes with an applied shear stress. A non-Newtonian fluid does not obey Newton's Law of viscosity. The shear stress is a non-linear function of the shear rate. Depending on how the apparent viscosity changes with shear rate, the flow behavior of the non-Newtonian Newtonian fluid will also change. An example of a non-Newtonian fluid is a soft condensed matter which occupies a middle ground between the extremes of a solid and a liquid. The soft condensed matter is easily deformable by external stresses. Examples of the soft condensed matter include emulsions, gels, colloids, foam, etc. As used herein, an emulsion is a mixture of immiscible liquids such as, for example, toothpaste, mayonnaise, oil in water, etc.

For more information about non-Newtonian fluid, reference can be made to U.S. patent application Ser. No. 11/153,957, filed on Jun. 15, 2005, and entitled "METHOD AND APPARATUS FOR CLEANING A SUBSTRATE USING NON-NEWTONIAN FLUIDS"; and U.S. patent application Ser. No. 11/154,129, filed on Jun. 15, 2005, and entitled "METHOD AND APPARATUS FOR TRANSPORTING A SUBSTRATE USING NON-NEWTONIAN FLUID." These patent applications, which are assigned to Lam Research Corporation, the assignee of the subject application, are incorporated herein by reference.

The non-Newtonian fluid defines a containment wall (wall) along one or more sides between the head surface and the surface of the substrate. The one or more sides of the containment wall define a treatment region on the substrate. A meniscus of Newtonian fluid is then applied to the surface of the substrate through the proximity head, such that the applied Newtonian fluid is substantially contained in the treatment region defined by the containment wall. The Newtonian fluid includes chemistry that aids in substantial removal of contaminants from the surface of the substrate when the Newtonian fluid flows within the containment wall of the non-Newtonian fluid in the treatment region.

The purpose of the containment wall formed by the non-Newtonian fluid is two-fold. First, the containment wall acts as a barrier or interface that substantially prevents the Newtonian fluid in the treatment region from flowing out, thereby conserving use of the Newtonian fluid. Additionally, some of these Newtonian fluids may have certain hazardous properties and so the Newtonian fluids have to be handled and disposed carefully. Utilizing the containment wall to control the Newtonian fluid, less amount of Newtonian fluid is expended while facilitating safe and efficient removal of contaminants from the surface of the substrate. Second, the containment wall acts as a barrier preventing any other external chemicals and contaminants from the ambient environment such as air, oxygen, nitrogen, etc. from flowing into the treatment region, so that highly concentrated and uncontaminated Newtonian fluids can be applied directly to the surface of the substrate. Controlled application of the Newtonian fluid provides for efficient and effective removal of contaminants from the surface of the substrate. The Newtonian fluid may be a chemistry that is substantially oxygen-free or a low oxygen chemistry that is applied to the surface of the substrate for removal of the contaminants. Utilizing non-Newtonian fluids to provide containment walls, a substantially oxygen-free or a low oxygen chemical treatment region can be achieved.

In one embodiment, the presence of oxygen in the treatment region may result in the oxygen reacting with layers of the semiconductor substrate, resulting in increased dielectric constants, poor adhesion characteristics of subsequent layers, and other material changes to the properties of semiconductor materials used in the fabrication process. The oxygen-free or a low oxygen chemical treatment region prevents oxidation of metal features within the treatment region, thereby, enhancing the functionality of the features.

FIG. 1 is a simplified schematic diagram of a proximity head 130 applying a non-Newtonian fluid and a meniscus of a Newtonian fluid to a surface 115 of a substrate 110 such that the Newtonian fluid is contained within one or more containment walls 140 of a non-Newtonian fluid. As shown, a substrate 110 is received on a carrier 120 using pins 122, in one embodiment of the invention. The pins 122 extend from the carrier defining a recessed region in which the substrate 110 may be fully received and held. In one embodiment, the pins only contact an edge exclusion region 113 along the outer edge of the substrate 110. The carrier 120 and the pin 122 are made of or coated with a chemically inert material, so that the carrier and the pins 122 do not react with the chemistries applied to clean or prepare the substrate 110. A non-Newtonian fluid 101 is applied using a proximity head 130. The non-Newtonian fluid 101 forms a containment wall 140 along one or more sides. The containment wall 140 defines a treatment region on the substrate 110. In this embodiment, the non-Newtonian fluid 101 is formed along two opposite sides forming containment walls 140 along the two opposite sides enclosing a channel in-between.

The enclosed channel, between the containment walls 140, defines a treatment region. This treatment region may occupy either a portion of a surface 115 of a substrate 110 or the entire surface 115 of the substrate 110 when applied to the surface 115 of the substrate 110. A Newtonian fluid 102 is then applied through the proximity head 130 such that the Newtonian fluid 102 is contained in the channel defining the treatment region formed by the non-Newtonian fluid 101. The Newtonian fluid 102 contained within the treatment region may scan the surface 115 of the substrate 110 providing treatment of the entire surface 115 of the substrate 110 when applied to the surface 115 of the substrate 110. The Newtonian fluid 102 aids in the removal of the contaminants from the surface 115 of the substrate 110 when the contaminants are exposed to the Newtonian fluid 102 contained in the treatment region.

Figure 2:
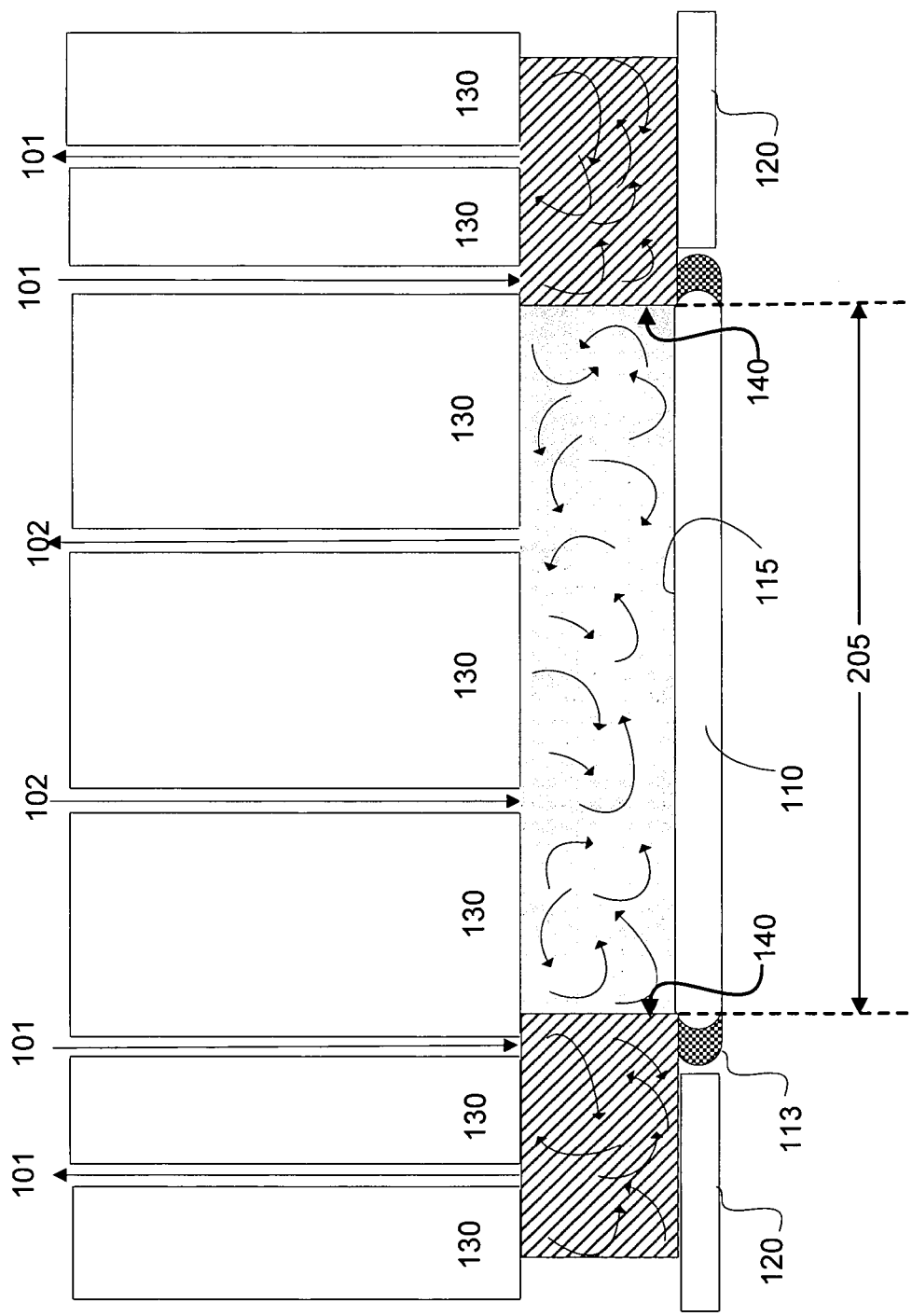
FIG. 2 illustrates a side schematic view of an alternate embodiment using proximity head to apply a non-Newtonian fluid and a Newtonian fluid to the surface of a substrate.

FIG. 2 illustrates a schematic representation of a single proximity head used in applying a non-Newtonian fluid 101 and a Newtonian fluid 102 to a surface 115 of a substrate 110. As shown, a substrate 110 having an edge exclusion region 113, is received on a pin 122 of a carrier 120. A proximity head 130 is used in applying a meniscus of a non-Newtonian fluid 101 and a Newtonian fluid 102. In this embodiment, the non-Newtonian fluid 101 is applied at about the edge exclusion region 113 through the proximity head 130 so that a containment wall 140 is formed along a portion of the edge of the substrate between the surface 115 of the substrate 110 and a head surface of the proximity head 130. Although, in this embodiment, the non-Newtonian fluid 101 is applied at the edge exclusion region 113, the non-Newtonian fluid (NNF) 101 is not confined to this region. The NNF 101 can be applied to any portion of the surface 115 of the substrate 110. The containment wall 140 defines a treatment region 205 on the surface 115 of the substrate 110. In this embodiment, the containment wall 140 is formed by a pair of walls 140 (or surrounded by walls) defining a channel for the treatment region 205. A Newtonian fluid 102 is applied to the surface 115 of the substrate 110 through the proximity head 130.

The Newtonian fluid 102 is applied such that the Newtonian fluid 102 is contained within the treatment region 205 defined by the containment wall 140. The channel enables the Newtonian fluid 102 to flow between the containment wall 140 formed by the non-Newtonian fluid 101. The Newtonian fluid 102 flowing between the containment wall 140 aids in the removal of one or more contaminants while preserving the functionality of the features formed on the substrate 110. The containment of the Newtonian fluid 102 within the containment wall 140 helps in expending less Newtonian fluid 102 while effectively removing contaminants from the surface 115 of the substrate 110.

The thickness of the containment wall 140 formed by the non-Newtonian fluid 101 can be varied based on one or more characteristics of the Newtonian fluid 102 applied to the surface of the substrate. Some of the characteristics of the Newtonian fluid 102 that may affect the thickness of the non-Newtonian fluid 101 may include viscosity, temperature, pressure exerted by the Newtonian fluid 102, chemistry of the Newtonian fluid, etc.

As noted above, the non-Newtonian fluid 101 is a fluid in which the viscosity changes with an applied shear force. An example of a non-Newtonian fluid 101 is a soft condensed matter which occupies a middle ground between the extremes of a solid and a liquid. The soft condensed matter is easily deformable by external stresses and examples of the soft condensed matter include emulsions, gels, colloids, foam, etc. It should be appreciated that an emulsion is a mixture of immiscible liquids such as, for example, toothpaste, mayonnaise, oil in water, etc. A colloid is polymers dispersed in water, and gelatin is an example of a colloid. Foam is gas bubbles defined in a liquid matrix, and shaving cream is an example of a foam.

The non-Newtonian fluid 101 applied to the surface of the substrate is selected such that it is substantially immiscible with the Newtonian fluid 102. The non-Newtonian fluid 101 may be a non-aqueous tri-state compound which includes a solid component, a liquid component and a gas component. The solid component is, in one embodiment, a fatty acid. The fatty acid is defined by one of lauric acid, palmitic acid, stearic acid, oleic acid, linoleic acid, linolenic acid, arachidonic acid, gadoleic acid, eurcic acid, butyric acid, caproic acid, caprylic acid, myristic acid, margaric acid, behenic acid, lignoseric acid, myristoleic acid, palmitoleic acid, nervanic acid, parinaric acid, timnodonic acid, brassic acid, clupanodonic acid, lignoceric acid, or cerotic acid.

The gas component is defined to occupy 5% to 99.9% of the tri-state compound by volume. In another embodiment, the gas portion can occupy between about 15% and about 40% of the tri-state body, and still another embodiment, the gas portion can occupy between about 20% and about 30% of the tri-state body. The gas or gases defining a gas portion can be either inert, e.g., nitrogen ($N_2$), argon (Ar), etc., or reactive, e.g., oxygen ($O_2$), ozone ($O_3$), hydrogen peroxide ($H_2O_2$), air, hydrogen ($H_2$), ammonia ($NH_3$), hydrogen fluoride (HF), hydrochloric acid (HCl), etc. In one embodiment, the gas portion includes only a single type of gas, for example, nitrogen ($N_2$). In another embodiment, the gas portion is a gas mixture that includes mixtures of various types of gases, such as: ozone ($O_3$), oxygen ($O_2$), carbon dioxide ($CO_2$), hydrochloric acid (HCl), hydrofluoric acid (HF), nitrogen (N2), and argon (Ar); ozone ($O_3$) and nitrogen ($N_2$); ozone ($O_3$) and argon (Ar); ozone ($O_3$), oxygen ($O_2$) and nitrogen ($N_2$); ozone ($O_3$), oxygen ($O_2$) and argon (Ar); ozone ($O_3$), oxygen ($O_2$), nitrogen ($N_2$), and argon (Ar); and oxygen ($O_2$), argon (Ar), and nitrogen ($N_2$). It should be appreciated that the gas portion can include essentially any combination of gas types as long as the resulting gas mixture can be combined with a liquid portion and a solid portion to form a tri-state compound that can be utilized in substrate cleaning or preparation operations.

The liquid component, being a continuous medium, is one is one of de-ionized (DI) water, a hydrocarbon, a base fluid, a hydrofluoric acid (HF) solution, an ammonia based solution, or mixtures of DI water and chemicals.

A bi-state compound is one that includes the solid component and a liquid component. For more information on tri-state compounds and the like, reference may be made to Provisional Application No. 60/755,377, filed Dec. 30, 2005, assigned to the assignee, and incorporated herein by reference.

Figure 3B:
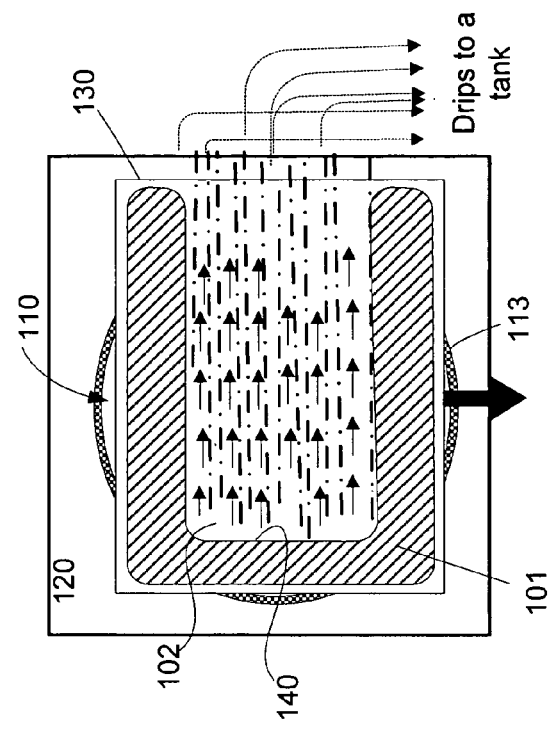
FIG. 3B is an alternative embodiment illustrated in FIG. 3A.
Figure 3D:
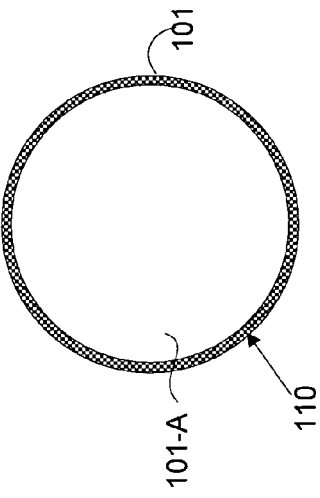
FIG. 3D is an alternate embodiment illustrated in FIG. 3C.
Figure 3A:
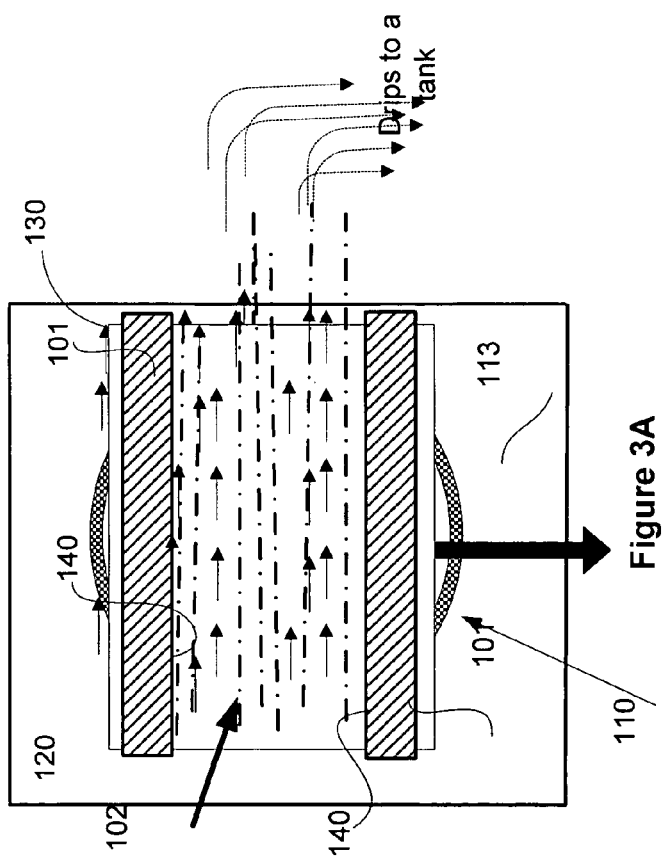
FIG. 3A is a schematic view illustrating a relative movement of the Newtonian fluid applied to the surface of a substrate, in one embodiment of the invention.

FIGS. 3A and 3B illustrate alternate embodiments of a proximity head applying a non-Newtonian fluid 101 and a Newtonian fluid 102 to a surface of a substrate and the relative movement of the proximity head to the movement of the substrate. As can be seen in FIG. 3A, the non-Newtonian fluid 101 applied to a surface of a substrate 110 between the surface 115 of the substrate 110 and a head surface of the proximity head 130 forms a containment wall 140 along two sides. A treatment region, defined by the two sides of the containment wall 140, further defines a channel to receive a Newtonian fluid 102 applied through the proximity head.

In one embodiment, the Newtonian fluid 102 can be applied at one extreme point of the channel such that the Newtonian fluid 102 flows in the channel towards the other extreme end. In another embodiment, the Newtonian fluid 102 is applied at the center of the channel such that the Newtonian fluid 102 flows from the center to the outer extremes of the treatment region. The Newtonian fluid 102 reacts with the contaminants on the surface of the substrate exposed to the treatment region and substantially removes the contaminants.

FIG. 3B illustrates a variation of FIG. 3A. In the embodiment illustrated in FIG. 3B, the non-Newtonian fluid 101 is applied between the surface 115 of the substrate 110 and a head surface of the proximity head such that the non-Newtonian fluid 101 forms a containment wall 140 along three sides. In this embodiment, a treatment region, defined by the containment wall 140, receives a Newtonian fluid 102 applied through the proximity head such that the Newtonian fluid 102 flows in the treatment region away from the containment wall 140 of the non-Newtonian fluid 101, as illustrated in FIG. 3B. The Newtonian fluid 102 reacts with the contaminants on the surface 115 of the substrate 110 covered by the treatment region and substantially removes the contaminants.

Figure 3C:
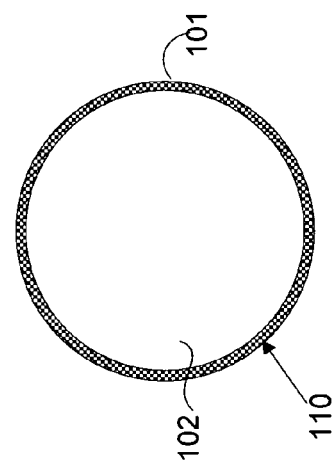
FIG. 3C is an alternate embodiment illustrated in FIGS. 3A and 3B.

FIGS. 3C and 3D illustrate alternate embodiments illustrated in FIGS. 3A and 3B. In the embodiment illustrated in FIG. 3C, a non-Newtonian fluid 101 is applied along an edge exclusion region between the surface 115 of the substrate 110 and a head surface of the proximity head such that the non-Newtonian fluid 101 forms a containment wall 140 along the edge exclusion region of the substrate 110. In this embodiment, the containment wall 140 defines a treatment region covering the entire surface 115 of the substrate 110. A Newtonian fluid 102 is applied through the proximity head such that the Newtonian fluid 102 flows within the containment wall 140 over the treatment region formed by the non-Newtonian fluid 101, as illustrated in FIG. 3C. The Newtonian fluid 102 reacts with the contaminants on the surface 115 of the substrate 110 within the treatment region and substantially removes the contaminants.

In an alternate embodiment illustrated in FIG. 3D, a second non-Newtonian fluid 101-A is applied in place of a Newtonian fluid 102 illustrated in FIG. 3C. In this embodiment, the containment wall 140, formed by the first non-Newtonian fluid 101 as illustrated in FIG. 3C, defines a treatment region covering the entire surface 115 of the substrate 110. A second non-Newtonian fluid 101-A is applied through the proximity head such that the second non-Newtonian fluid 101-A flows within the containment wall 140 in the treatment region formed by the first non-Newtonian fluid 101, as illustrated in FIG. 3D. The second non-Newtonian fluid 101-A reacts with the contaminants on the surface 115 of the substrate 110 within the treatment region and substantially removes the contaminants.

Figure 4:
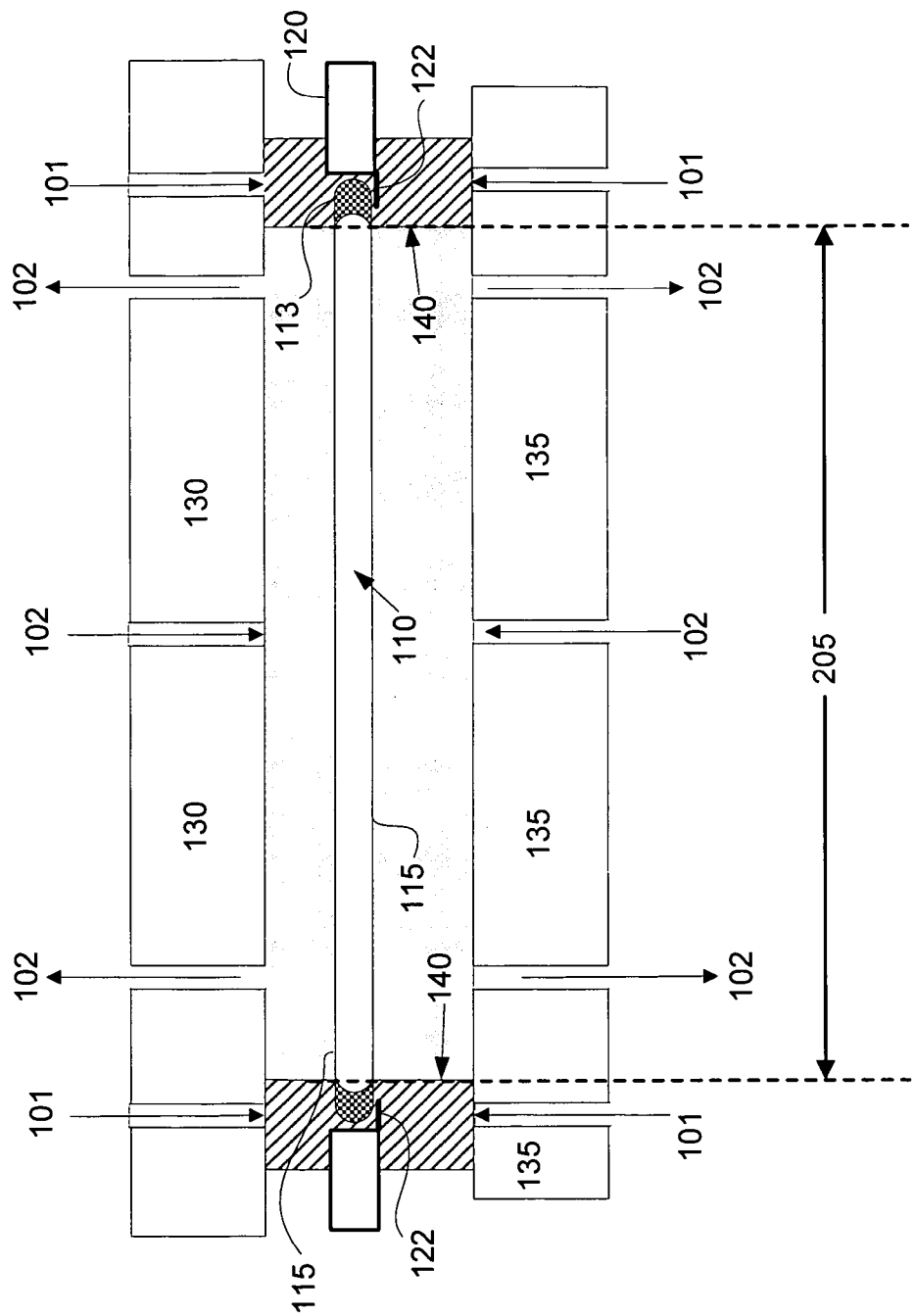
FIG. 4 illustrates a simplified schematic diagram of a dual proximity head used in applying a non-Newtonian fluid and a Newtonian fluid to a surface of the substrate, in one embodiment of the invention.
Figure 7:
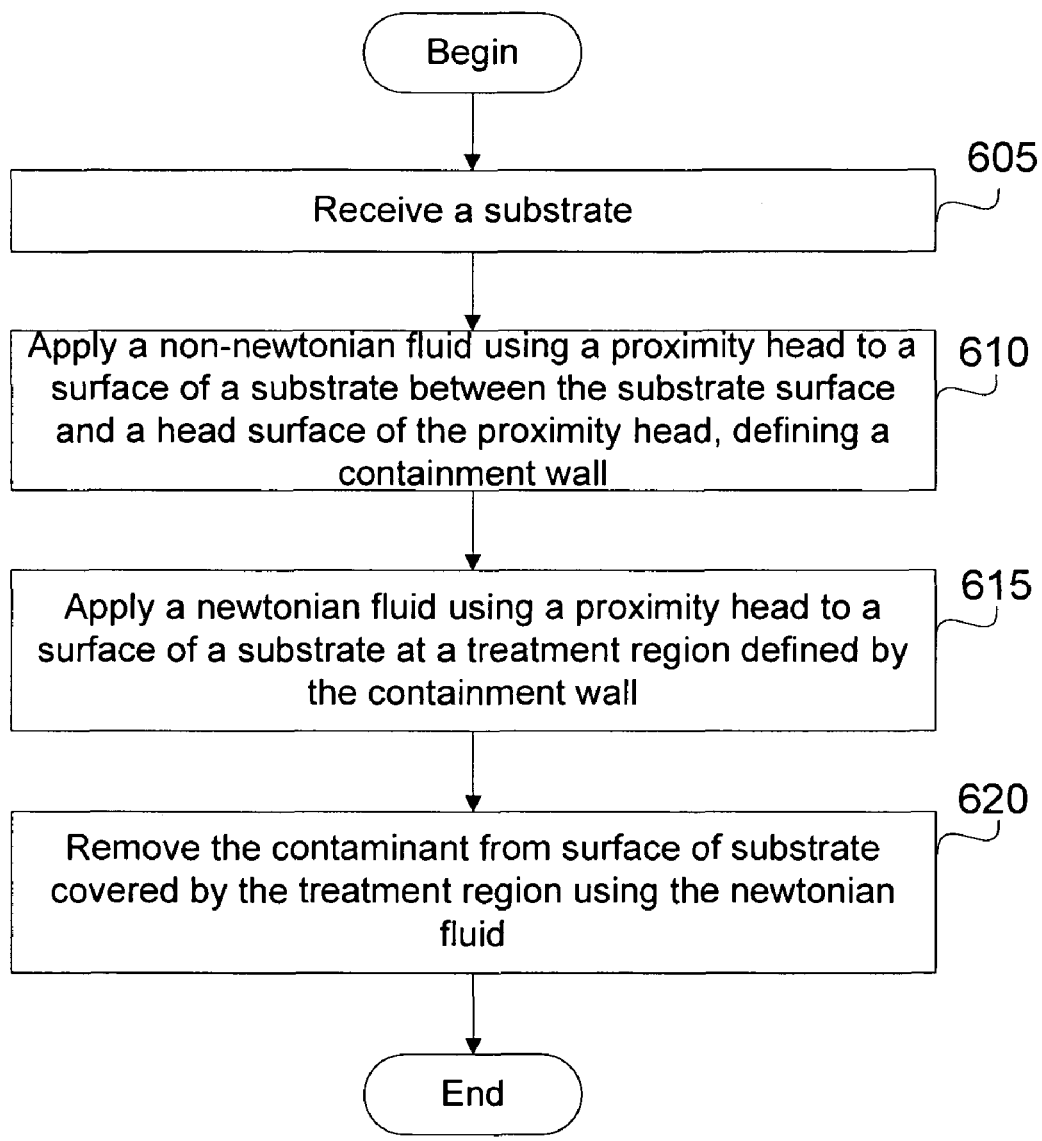
FIG. 7 illustrates various operations involved in providing a contained chemical surface treatment to a surface of a substrate, in one embodiment of the invention.

FIG. 4 illustrates a simplified schematic representation of an apparatus containing a dual proximity head that is used to apply a non-Newtonian fluid 101 and a Newtonian fluid 102 to a surface 115 of a substrate 110, in one embodiment of the invention. In this embodiment described in conjunction with the process operations of FIG. 7, a substrate 110 is received and mounted on a carrier 120 and moved along a plane as illustrated in operation 605. The carrier 120 is configured to hold the substrate 110 along a plane, move the substrate 110 along a lateral axis and rotate the substrate 110 along an axis of rotation so that different portions of a surface 115 of the substrate 110 are exposed to a Newtonian fluid 102 applied to the surface 115 of the substrate 110. The substrate 110 includes an edge exclusion region 113. The carrier 120 includes a pin 122, which receives and holds the substrate 110, and motors and wheels (not shown) to move the substrate 110 along the lateral axis and to rotate the substrate 110 along the axis of rotation. The carrier 120 moves along the lateral axis so as to expose various portions of the substrate 110 to the Newtonian fluid 102. The speed of the carrier along the lateral axis can be adjusted to allow substantial exposure of the surface 115 of the substrate 110 to the Newtonian fluid 102 for effective removal of contaminants from the surface 115 of the substrate 110.

In addition to a lateral movement, the carrier 120 is configured to rotate the substrate along the axis of rotation. The substrate is rotated at a velocity so as to enable substantial exposure of the surface of the substrate to the Newtonian fluid 102 for effective removal of the contaminants from the surface 115 of the substrate 110. The embodiment illustrated in FIG. 4 further illustrates application of the Newtonian fluid 102 at the center of the treatment region and removed from the extreme ends of the treatment region such that the Newtonian fluid 102 flows within the treatment region substantially removing the contaminants from the surface of the substrate exposed to the treatment region 205.

Continuing reference to FIG. 4, two proximity heads 130 and 135 are mounted such that they are parallel to each other and provide appropriate space for the carrier 120 with the substrate 110 to move along an axis between the two proximity heads 130 and 135 such that the proximity heads 130 and 135 cover at least a portion of the top and bottom surfaces of the substrate 115, respectively. A non-Newtonian fluid applicator in the proximity heads 130 and 135 is used to apply a non-Newtonian fluid 101 between the surface 115 of the substrate 110 and the head surface of the proximity heads 130 and 135, as illustrated in operation 610. The non-Newtonian fluid applicator (not shown) includes a reservoir to hold the non-Newtonian fluid 101 with an inlet for receiving the non-Newtonian fluid 101 and an outlet for supplying the non-Newtonian fluid 101 to the surface of the substrate 115 through the proximity heads 130 and 135. The non-Newtonian fluid applicator supplies the non-Newtonian fluid 101 in the form of a fluid meniscus to the surface 115 of the substrate 110.

The non-Newtonian fluid 101 forms a containment wall 140 defining a treatment region 205 on the respective surfaces 115 of the substrate 110. In the embodiment illustrated in FIG. 4, a treatment region 205 is formed at the top and bottom surfaces 115 of the substrate 110 covering the entire surface 115 of the substrate 110, by applying the non-Newtonian fluid 101 at the edge exclusion region 113 of the top and bottom surfaces 115 of the substrate 110.

A Newtonian fluid applicator in or connected to the proximity heads 130 and 135 is used to apply a Newtonian fluid 102 between the respective surfaces 115 of the substrate 110 and the respective head surface of the proximity heads 130 and 135 such that the Newtonian fluid 102 is substantially contained within the treatment region 105 formed on the top and bottom surfaces 115 of the substrate 110, as illustrated in operation 615. The Newtonian fluid applicator (not shown) includes a reservoir for the Newtonian fluid 102 with an inlet and a pair of outlets. The inlet is used for receiving cleaner and fresher Newtonian fluid 102 into the Newtonian fluid applicator.

A first outlet is used for supplying the Newtonian fluid 102 to the surface of the substrate through the proximity heads 130 and 135. A second outlet at the Newtonian fluid applicator is used to remove the Newtonian fluid mixed with the contaminants so that cleaner Newtonian fluid 102 can be introduced for more effective cleaning. The Newtonian fluid applicator supplies the Newtonian fluid 102 in the form of a fluid meniscus to the surface 115 of the substrate 110 within the treatment region 205. A channel defined by the containment wall 140 and formed within the treatment region 205 enables the Newtonian fluid 102 to flow between the walls 140 of the non-Newtonian fluid 101. The Newtonian fluid 102 flowing in the channel acts on one or more contaminants and removes the contaminants from the top and bottom surfaces 115 of the substrate 110 at the treatment region 205, as illustrated in operation 620.

The speed of the carrier 120 carrying the substrate 110 may be adjusted so that the pressure of the Newtonian fluid 102 exerted on the non-Newtonian fluid 101 when applied by the proximity heads 130 and 135 are counter-balanced by a shift of non-Newtonian fluid 101 caused by the movement of the carrier 120. Similarly, the thickness of the non-Newtonian fluid 101 can be adjusted based on one or more characteristics of the Newtonian fluid 102 in order to enable the non-Newtonian fluid 101 to substantially contain the Newtonian fluid 102.

In another embodiment, the non-Newtonian fluid 101 is applied between the surface of a carrier 120 and the head surface of the proximity head at an area on the carrier 120 just outside the edge exclusion region 113 of the substrate 110 received on the carrier 120 so that the non-Newtonian fluid 101 forms a treatment region 205 that covers the entire top and bottom surface 115 of the substrate 110. In this embodiment, the containment wall 140 of non-Newtonian fluid meniscus forms a circular barrier between the head surface of the proximity head 130 and the top surface of the carrier 120 just outside the edge exclusion region of the substrate 113. In the embodiments discussed above with reference to FIG. 4, the containment wall 140 of the non-Newtonian fluid 101 forms a circular barrier between the head surface of the proximity heads and the top and bottom substrate surfaces 115.

However, it is not necessary that the entire top and bottom surface 115 of the substrate 110 be enclosed by the treatment region. In another embodiment, the proximity heads 130 and 135 can be used to apply the non-Newtonian fluid 101 to the surface 115 of the substrate 110 such that a treatment region 205 is formed at the top and bottom surface 115 of the substrate 110 covering only a portion of the surface 115 of the substrate 110. In this embodiment, the substrate 110, in addition to being moved along a lateral axis, is rotated along an axis of rotation when the substrate 110 is under the proximity heads 130 and 135 so that different portions of the surface 115 of the substrate 110 are substantially exposed to the Newtonian fluid 102 contained within the treatment region 205.

In this embodiment, the proximity heads may not necessarily be a "head" in configuration, but may be any suitable configuration, shape, and/or size such as, for example, a manifold, a circular puck, a bar, a square, an oval puck, a tube, plate, etc., as long as the non-Newtonian fluid applicator and the Newtonian fluid applicator may be configured in a manner that would enable the generation of a controlled, stable, manageable fluid meniscus of non-Newtonian 101 and Newtonian fluids 102.

The embodiments of the current invention are not restricted to applying a non-Newtonian fluid 101 and a Newtonian fluid 102 to the surface of the substrate. The embodiments of the current invention illustrated in FIG. 4 may also be used to apply more than one non-Newtonian fluid 101 to the surface of the substrate. In this embodiment, the proximity head is equipped with two non-Newtonian fluid applicators. A first non-Newtonian fluid applicator is used to supply a first non-Newtonian fluid 101 between the surface 115 of the substrate 110 and the head surface of the proximity heads 130 and 135 such that the first non-Newtonian fluid 101 forms a containment wall 140 defining a treatment region 205 on the respective surfaces 115 of the substrate 110. Although the embodiment illustrated in FIG. 4 shows the treatment region 205 covering the entire top and bottom surface 115 of the substrate 110, the treatment region 205 may cover only a portion of the top and bottom surface 115 of the substrate 110. A second non-Newtonian fluid applicator is used to apply a second non-Newtonian fluid 101-A, that is different from the first non-Newtonian fluid 101, to the treatment region 205 such that the second non-Newtonian fluid 101-A is substantially contained within the treatment region formed on the top and bottom surfaces 115 of the substrate 110. The second non-Newtonian fluid 101-A flowing within the treatment region 205 reacts with the contaminants present on the surface of the substrate exposed to the treatment region 205 substantially removing the contaminants.

Figure 5:
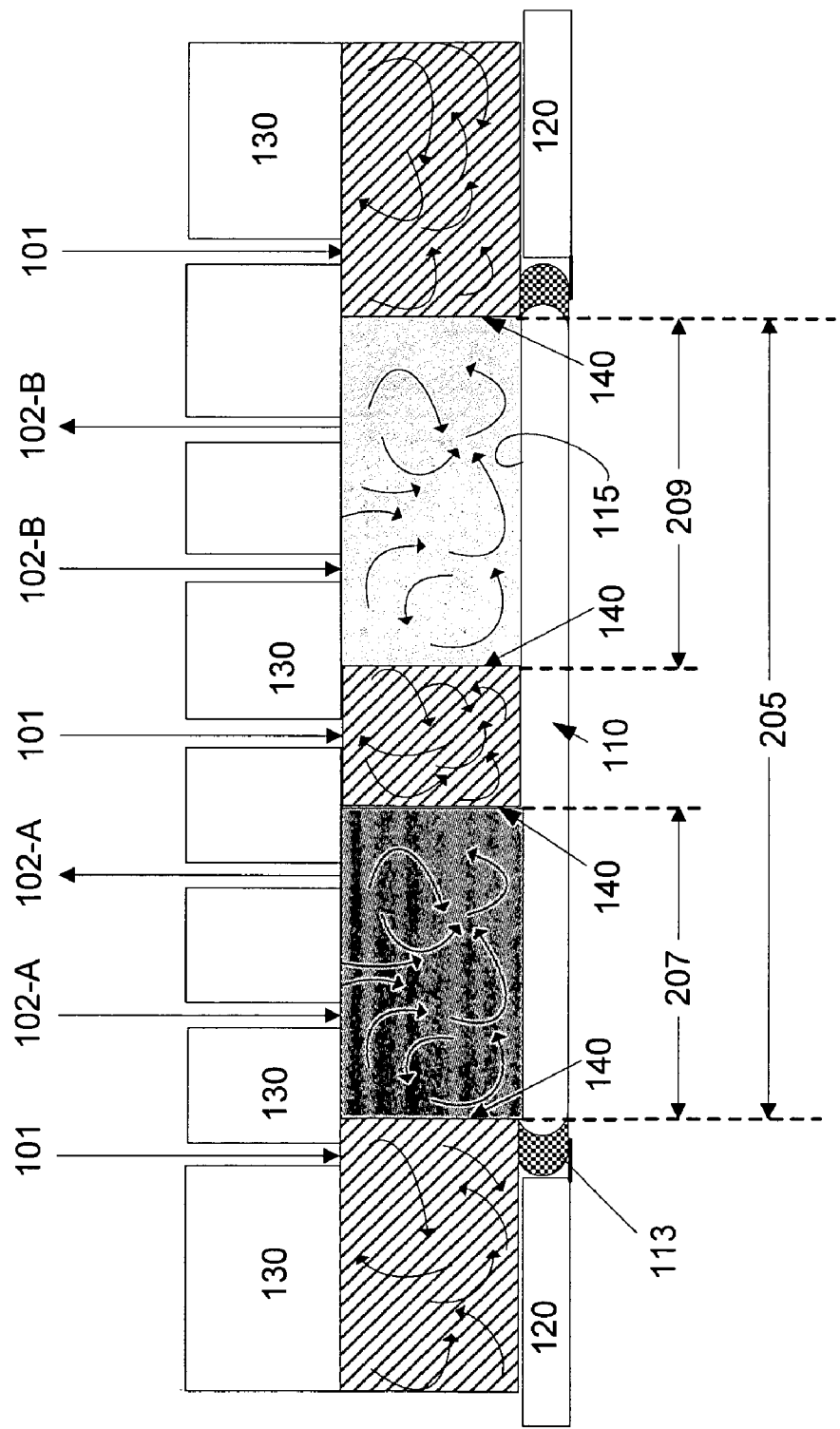
FIG. 5 illustrates a simplified schematic diagram of a proximity head used in applying a non-Newtonian fluid and two different types of Newtonian fluids to the surface of the substrate, in one embodiment of the invention.

The embodiments of the current invention is not restricted to applying a single type of Newtonian fluid 102 to the surface of the substrate. The embodiments of the current invention can also be used to apply more than one type of Newtonian fluid 102 to the surface of the substrate. FIG. 5 illustrates a variation of a proximity head 130 used in applying more than one type of Newtonian fluid 102 to the surface 115 of the substrate 110.

In the embodiment illustrated in FIG. 5, a non-Newtonian fluid 101 is applied using a proximity head 130 between the surface 115 of the substrate 110 and a head surface of the proximity head 130. The applied non-Newtonian fluid 101 defines a containment wall 140 along one or more sides between the head surface and the substrate surface 115. In this embodiment, the non-Newtonian fluid 101 is applied along an edge exclusion region 113 of the substrate 110 such that the containment wall 140 encloses a treatment region 205 covering the remainder of the substrate surface 115.

A first Newtonian fluid 102-A is applied using the proximity head 130 to the surface 115 of the substrate 110 such that the first Newtonian fluid 102-A is substantially contained within a first treatment sub-region 207 in the treatment region 205 of the substrate 110 defined by the containment wall 140. A second Newtonian fluid 102-B is applied using the proximity head 130 to the surface of the substrate 115 so that the second Newtonian fluid 102-B is substantially contained within a second treatment sub-region 209 in the treatment region 205 of the substrate 110. The first Newtonian fluid 102-A and the second Newtonian fluid 102-B are different from each and are chosen such that they are substantially immiscible with the non-Newtonian fluid 101. The first treatment sub-region 207 is separated from the second treatment sub-region 209 by the non-Newtonian fluid 101. The two Newtonian fluids 102-A and 102-B independently act on the various contaminants that are present on the surface 115 of the substrate 110 when applied at the treatment region 205 and help in substantially removing the contaminants from the surface 115 of the substrate 110.

In an alternate embodiment of FIG. 5, a second and third non-Newtonian fluids 101-A and 101-B are applied within the treatment region 205 instead of a first and second Newtonian fluids 102-A and 102-B. In this embodiment, a first non-Newtonian fluid 101 is applied using a proximity head 130 between the surface 115 of the substrate 110 and a head surface of the proximity head 130. The applied non-Newtonian fluid 101 defines a containment wall 140 along one or more sides between the head surface and the substrate surface 115. In this embodiment, the first non-Newtonian fluid 101 is applied along an edge exclusion region 113 of the substrate 110 such that the containment wall 140 encloses a treatment region 205 covering the remainder of the substrate surface 115. A second non-Newtonian fluid 101-A is applied using the proximity head 130 to the surface 115 of the substrate 110 such that the second non-Newtonian fluid 101-A is substantially contained within a first treatment sub-region 207 in the treatment region 205 of the substrate 110 defined by the containment wall 140. A third non-Newtonian fluid 101-B is applied using the proximity head 130 to the surface of the substrate 115 so that the third non-Newtonian fluid 101-B is substantially contained within a second treatment sub-region 209 in the treatment region 205 of the substrate 110. The second and third non-Newtonian fluids 101-A and 101-B are different from each other and from the first non-Newtonian fluid 101 and are chosen such that they are substantially immiscible with the first non-Newtonian fluid 101. The first treatment sub-region 207 is separated from the second treatment sub-region 209 by the first non-Newtonian fluid 101. The two non-Newtonian fluids 101-A and 101-B within the treatment region independently act on the various contaminants that are present on the surface 115 of the substrate 110 exposed at the treatment region 205 and help in substantially removing the contaminants from the surface 115 of the substrate 110.

In an alternate embodiment, the first non-Newtonian fluid 101 is applied to the surface of the substrate between the head surface of the proximity head and the surface 115 of the substrate 110 defining a treatment region 205. In this embodiment, a second non-Newtonian fluid 101-A is applied to the surface of the substrate such that it is contained within a first sub-region 207 of the treatment region 205. A Newtonian fluid 102 is applied to the surface 115 of the substrate 110 such that the Newtonian fluid 102 is substantially contained within the second sub-region 209 of the treatment region 205. The second non-Newtonian fluid 101-A and the Newtonian fluid 102 are chosen such that they are different from the first non-Newtonian fluid 101 and are substantially immiscible with the first non-Newtonian fluid 101. The first treatment sub-region 207 is separated from the second treatment sub-region 209 by the first non-Newtonian fluid 101. The second non-Newtonian fluid 101-A and the Newtonian fluid 102 within the treatment region independently act on the various contaminants that are present on the surface 115 of the substrate 110 exposed in the treatment region 205 and help in substantially removing the contaminants from the surface 115 of the substrate 110.

Figure 6B:
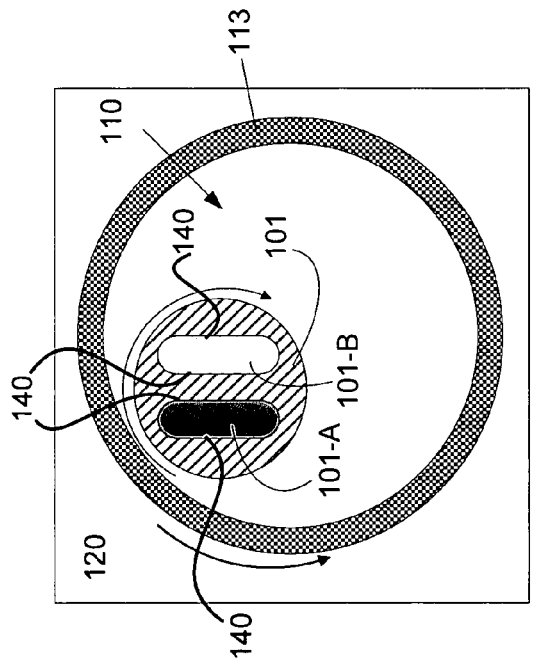
FIG. 6B is an alternate embodiment illustrated in FIG. 6A.
Figure 6C:
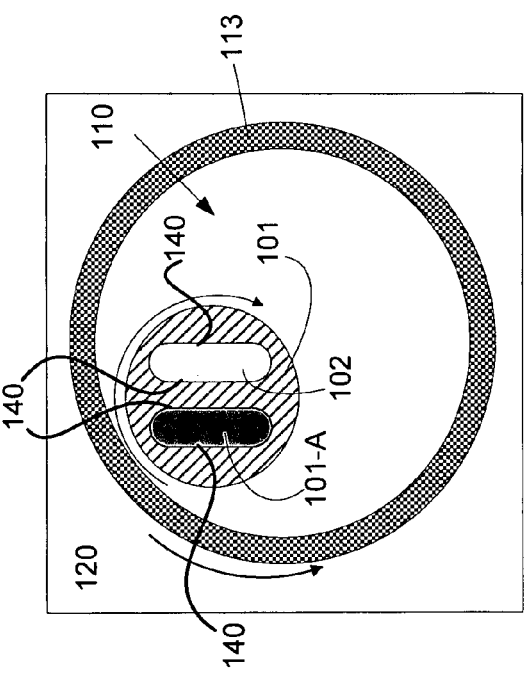
FIG. 6C is an alternate embodiment illustrated in FIGS. 6A and 6B.
Figure 6A:
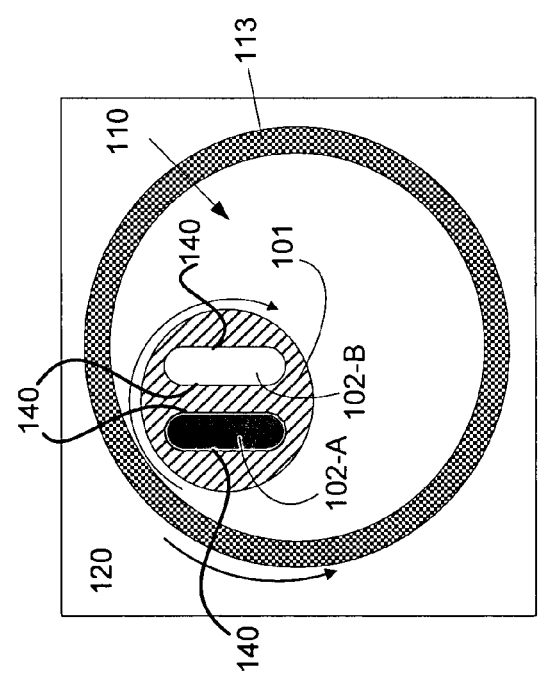
FIG. 6A illustrates an application of a non-Newtonian fluid and two different types of Newtonian fluids to the surface of the substrate illustrated in FIG. 5, in one embodiment of the invention.

In another embodiment illustrated in FIG. 6A, the treatment region 205 is defined by the containment wall 140 that covers only a portion of the surface 115 of the substrate 110. In this embodiment, various portions of the surface 115 of the substrate 110 are continuously exposed to a first and second Newtonian fluids 102-A and 102-B by moving the surface 115 of the substrate 110 and/or the proximity head 130 so that each of the two Newtonian fluids 102-A and 102-B independently act on the contaminants present on the surface within the treatment region substantially removing them from the surface 115 of the substrate 110.

In an alternate embodiment illustrated in FIG. 6B, a second and third non-Newtonian fluids 101-A and 101-B are applied to the surface 115 of the substrate 110 such that the second and third non-Newtonian fluids 101-A and 101-B are substantially contained within the first sub-region and second sub-region 207 and 209 within the treatment region 205. As mentioned with reference to FIG. 6A, various portions of the substrate 110 are continuously exposed to the two non-Newtonian fluids 101-A and 101-B contained within the treatment region 205 by moving the surface of the substrate 110 and/or the proximity head 130. The two non-Newtonian fluids 101-A and 101-B independently act on the contaminants found on the surface 115 of the substrate 110 substantially removing them.

In yet another embodiment illustrated in FIG. 6C, a second non-Newtonian fluid 101-A is applied to the first sub-region 207 within the treatment region 205 and a Newtonian fluid 102 is applied to the second sub-region 209 within the treatment region 205. In this embodiment as mentioned with reference to FIGS. 6A and 6B, various portions of the surface 115 of the substrate 110 are continuously exposed to the second non-Newtonian fluid 101-A and the Newtonian fluid 102 by moving the surface 115 of the substrate 110 and/or the proximity head 130 so that each of the second non-Newtonian fluid 101-A and the Newtonian fluid 102 independently act on the contaminants present on the surface within the treatment region substantially removing them from the surface 115 of the substrate 110.

In a typical fabrication process of a substrate, chemistry used in the fabrication or the external uncontrolled environment may cause oxidation of features or layers formed at the substrate. This oxidation may affect later processing. For instance, excessive oxidation may prevent some layers to properly adhere or can cause less than desired conductive interfaces between layers or features. For example, in electroless deposition of metal layers, the electroless plating process is highly dependent on the surface characteristics and composition of the substrate 110. When oxidation occurs on the surface of the substrate, the electroless deposition process is inhibited by the formation of an atomically thin metal oxide layer formed due to the presence of oxygen. An additional step of removing the oxidized (metal oxide) layer has to be performed prior to the electroless deposition process resulting in increased cost, and time for the overall fabrication. Managing surface preparation sequence prior to subsequent fabrication is critical in the overall fabrication process.

Figure 8A:
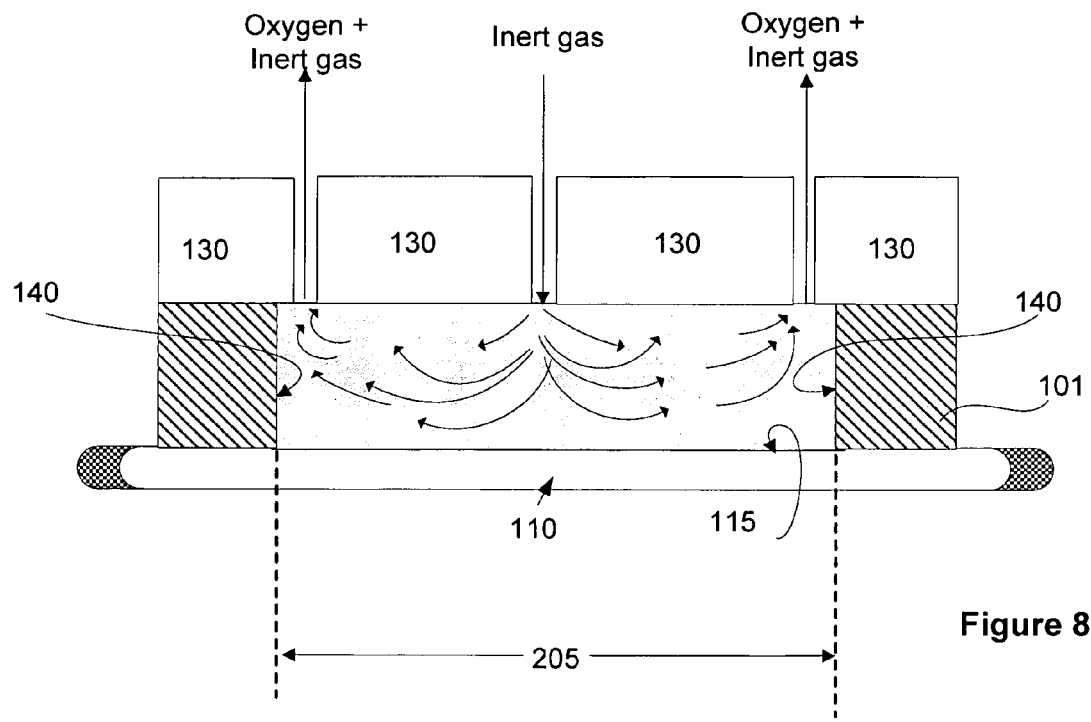
FIG. 8A through 8D is an alternative embodiment illustrated in FIG. 3A, in one embodiment of the invention.

In an embodiment, illustrated in FIGS. 8A-8D, a proximity head 130 is used in providing a substantially oxygen-free environment within a treatment region on the substrate in order to facilitate forming other features, structures or layers on a surface 115 of a substrate 110. Referring to FIG. 8A, a non-Newtonian fluid 101 is applied using the proximity head 130 between the surface 115 of the substrate 110 and a head surface of the proximity head 130. The applied non-Newtonian fluid 101 defines a containment wall 140 along a containment region 205 between the head surface and the surface 115 of the substrate 110. In one embodiment, the non-Newtonian fluid 101 is applied along an edge exclusion region 113 of the substrate 110 such that the containment wall 140 encloses a treatment region 205 covering an entire active surface 115 of the substrate 110.

In one embodiment, an inert gas may be applied to the treatment region 205 using the proximity head 130, to the surface 115 of the substrate 110, such that the inert gas occupies the treatment region 205, displacing any chemistries or gases that might be present within the treatment region 205. The application of the inert gas to the treatment region 205 provides a substantially oxygen-free environment in the treatment region 205, that is substantially isolated from an external uncontrolled environment.

By creating a substantially oxygen-free environment in the treatment region and substantially isolating the treatment region 205 with the containment wall 140, it is possible to clean, prepare, or fabricate different layers, features, or structures (such as electroplating or electroless plating, etching, etc.) immediately after processing of other features, layers or structures, while preventing the substrate from coming into contact with the external uncontrolled environment (e.g. environment having more oxygen or other undesired elements including moisture than may be desired).

The inert gas, as referred herein, is used to control the treatment region between the head surface of the proximity head and the surface of the substrate, wherein the non-Newtonian fluid creates an enclosed treatment region 205. In one embodiment, an inert gas controlling system (not shown) may be coupled to one or more ports of the proximity head 130 via a manifold (not shown). The manifold uses computer controls or manual controls to control what is introduced through the ports into the treatment region.

In one example, the inert gas controlling system may include pumps, gauges, controls and valves that meter and control the pumping of inert gas into the treatment region and the oxygen or chemicals out of the treatment region. Clean room facilities (not shown) may also couple to the inert gas controlling system, so that inert gas can be applied through the proximity head, and thus allows the replacement of oxygen with an inert gas. (i.e., the space previously occupied by oxygen or chemicals containing oxygen is now filled with inert gas). The pumps that remove the oxygen or other chemicals are monitored, so that proper conditions can be maintained during any stages of fabrication process. Meters, manual controls and/or computer controls can monitor and adjust the pumping and flows of inert gases, such as N2, Ar, He, Ne, Kr, Xe, etc. with out limitation.

Figure 8B:
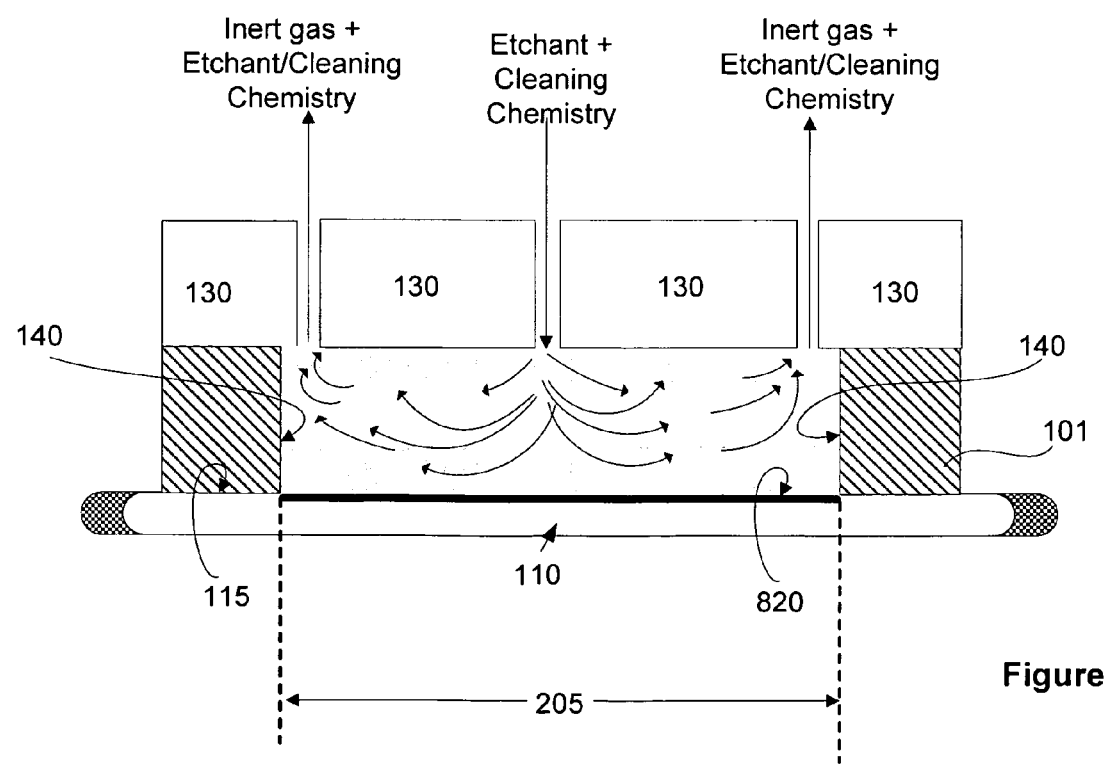
Figure 8C:
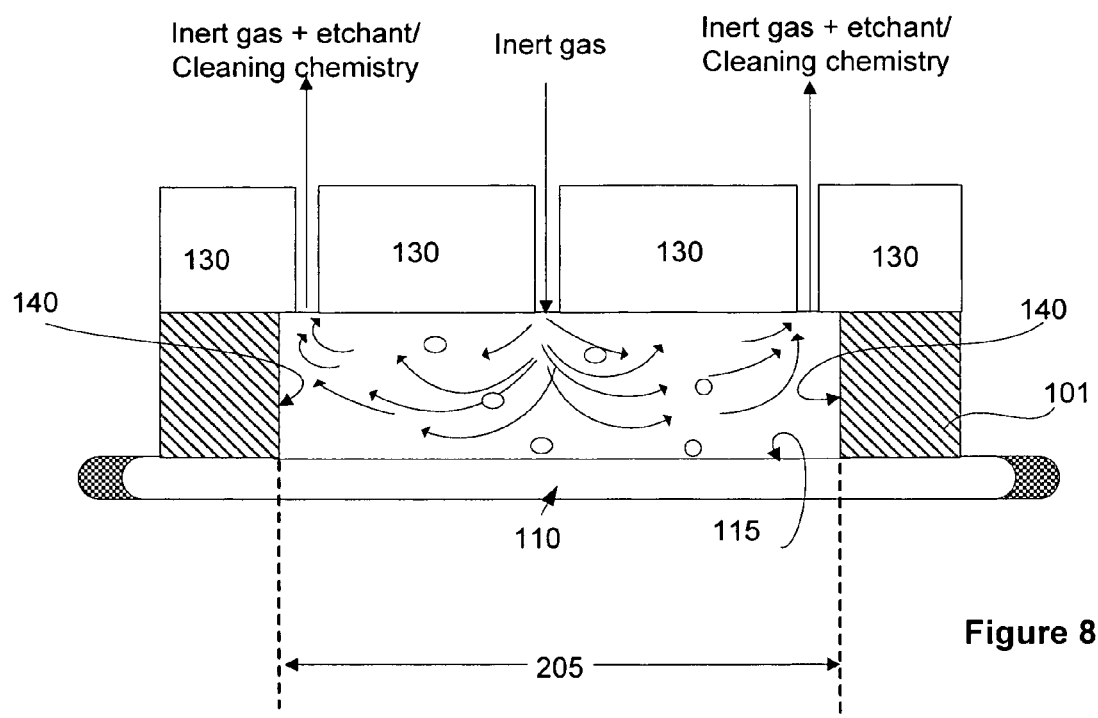

Referring to FIG. 8B, a barrier layer 820 may be formed at the treatment region. Barrier materials may be, for instance, TaN, Ta, Ru, among others. Barrier layer 820 can be formed using an electroless plating process, for example. An etching chemical may be introduced into the treatment region to allow removal of oxides, or further processing of the barrier layer 820. The cleaning or etching of the barrier layer 820, however, is done outside of the presence of oxygen, as the treatment region 205 is kept substantially oxygen free. The preparation of the barrier layer 820 may be followed by another inert gas application so that chemicals used in forming the barrier layer 820 can be substantial removed, treated, cleaned, etc., as shown in FIG. 8C.

In addition to providing a substantially oxygen-free environment within the treatment region 205, the defined embodiments prevent uncontrolled de-wetting of the surface of the substrate by controlling the environment within the treatment region, thereby providing for a highly efficient fabrication process.

Figure 8D:
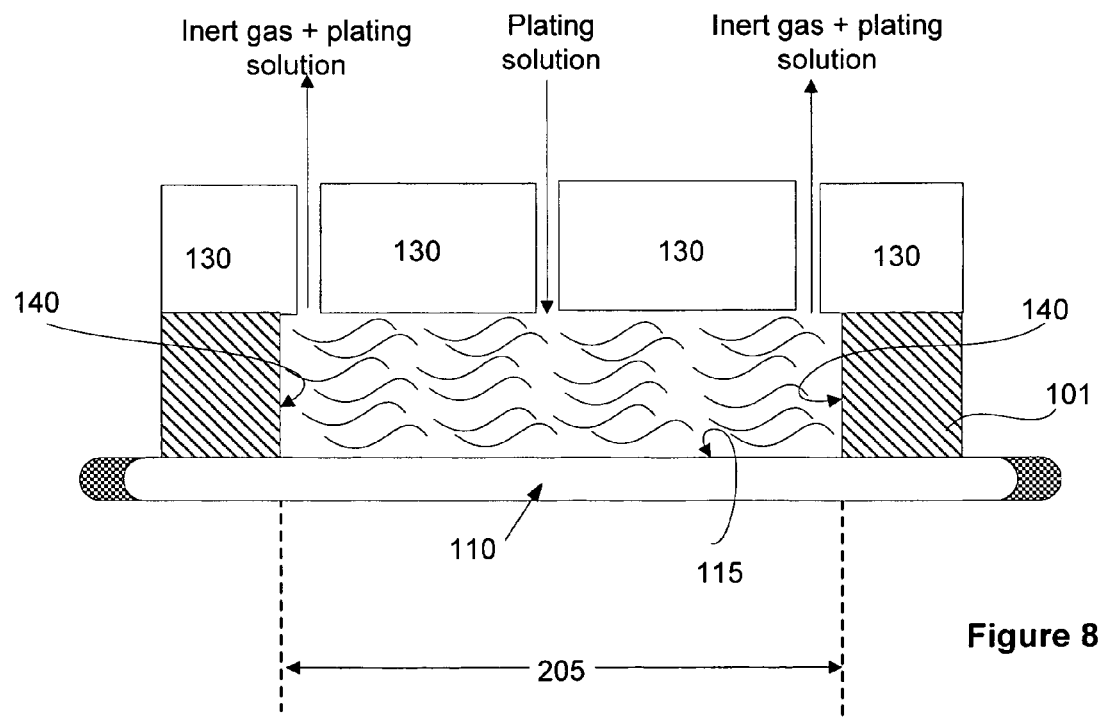

As illustrated in FIG. 8D, the fabrication process may continue with another plating application. The plating application may use an electroplating or electroless plating process to deposit the plating layer on a layer of the substrate 110. The electroplating process, where contact with the substrate is required, or electroless plating process used in forming a plating layer on the surface of the substrate may be configured in any number of forms.

Example systems and processes for performing plating operations are described in more detail in: (1) U.S. Pat. No. 6,864,181, issued on Mar. 8, 2005; (2) U.S. patent application Ser. No. 11/014,527 filed on Dec. 15, 2004 and entitled "WAFER SUPPORT APPARATUS FOR ELECTROPLATING PROCESS AND METHOD FOR USING THE SAME"; (3) U.S. patent application Ser. No. 10/879,263, filed on Jun. 28, 2004 and entitled "METHOD AND APPARATUS FOR PLATING SEMICONDUCTOR WAFERS"; (4) U.S. patent application Ser. No. 10/879,396, filed on Jun. 28, 2004 and entitled "ELECTROPLATING HEAD AND METHOD FOR OPERATING THE SAME"; (5) U.S. patent application Ser. No. 10/882,712, filed on Jun. 30,2004 and entitled "APPARATUS AND METHOD FOR PLATING SEMICONDUCTOR WAFERS"; (6) U.S. patent application Ser. No. 11/205, 532, filed on Aug. 16, 2005, and entitled "REDUCING MECHANICAL RESONANCE AND IMPROVED DISTRIBUTION OF FLUIDS IN SMALL VOLUME PROCESSING OF SEMICONDUCTOR MATERIALS"; and (7) U.S. patent application Ser. No. 11/398,254, filed on Apr. 4, 2006, and entitled "METHODS AND APPARATUS FOR FABRICATING CONDUCTIVE FEATURES ON GLASS SUBSTRATES USED IN LIQUID CRYSTAL DISPLAYS"; each of which is herein incorporated by reference. Thus, embodiments of the current invention may be used in providing a substantially oxygen-free environment within a treatment region.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for preparing a surface of a substrate using a proximity head, comprising:

applying a non-Newtonian fluid between the surface of the substrate and a head surface of the proximity head, the non-Newtonian fluid defining a containment wall along one or more sides between the head surface and the surface of the substrate, the one or more sides of the non-Newtonian fluid defining a treatment region on the substrate between the head surface and the surface of the substrate; and applying a Newtonian fluid to the surface of the substrate through the proximity head, such that the Newtonian fluid is substantially excluded from an area occupied by the non-Newtonian fluid and substantially maintained within the treatment region due to the containment wall, the Newtonian fluid aiding in the removal of one or more contaminants from the surface of the substrate.

2. The method for preparing a surface of a substrate using a proximity head as recited in claim 1, further comprising:

defining the one or more sides of the non-Newtonian fluid as a pair of walls between the head surface and the surface of the substrate, the pair of walls defining a channel for the treatment region, the channel enabling the Newtonian fluid to flow between the non-Newtonian fluid within the channel.

3. The method for preparing a surface of a substrate using a proximity head as recited in claim 1, wherein the one or more containment walls include a leading wall and a trailing wall, the leading wall formed by the non-Newtonian fluid and the trailing wall formed by vacuum such that the Newtonian fluid is enclosed between a leading wall of the non-Newtonian fluid and the trailing wall of vacuum.

4. The method for preparing a surface of a substrate using a proximity head as recited in claim 1, further comprising:
defining the one or more sides of the non-Newtonian fluid as a single wall between the head surface and the surface of the substrate, the single wall defining the treatment region, the single wall enabling the Newtonian fluid to flow in one direction away from the non-Newtonian fluid.

5. The method for preparing a surface of a substrate using a proximity head as recited in claim 1, further comprising:
defining the one or more sides of the non-Newtonian fluid as a set of three walls between the head surface and the surface of the substrate, the set of three walls defining a channel for the treatment region with an open side, the channel enabling the Newtonian fluid to flow between the non-Newtonian fluid towards the open side.

6. The method for preparing a surface of a substrate using a proximity head as recited in claim 1, further comprising:
defining the one or more sides of the non-Newtonian fluid as a substantial circle between the head surface and the surface of the substrate, the substantial circle defining a channel for the treatment region, the channel enabling the Newtonian fluid to flow between the non-Newtonian fluid.

7. The method for preparing a surface of a substrate using a proximity head as recited in claim 6, wherein the substantial circle is formed at an edge exclusion region of the substrate.

8. The method for preparing a surface of a substrate using a proximity head as recited in claim 6, wherein the substantial circle is formed on a surface of a carrier just outside an edge exclusion region of the substrate, the carrier enabling mounting and transporting of the substrate.

9. The method for preparing a surface of a substrate using a proximity head as recited in claim 1, wherein the containment wall defining the treatment region having a thickness defined by one or more characteristics of the contained Newtonian fluid.

10. The method for preparing a surface of a substrate using a proximity head as recited in claim 1, wherein the treatment region enabling one of an oxygen-free or a substantially low oxygen environment so as to preserve the one or more features and layers formed on the surface of the substrate.

11. The method for preparing a surface of a substrate using a proximity head as recited in claim 1, wherein the non-Newtonian fluid is substantially immiscible with the Newtonian fluid and is defined as one or more of a foam, a colloid, a gel and an emulsion.

12. The method for preparing a surface of a substrate using a proximity head as recited in claim 1, wherein the non-Newtonian fluid is one of a tri-state compound or a bi-state compound.

13. The method for preparing a surface of a substrate using a proximity head as recited in claim 1, wherein the Newtonian fluid is an acid or a base based on a type of one or more features or layers formed at the surface of the substrate and includes one of hydrofluoric acid (HF), DIW, citric acid, ammonia containing fluids, or mixture of chemicals and DI water.

14. A method for preparing a surface of a substrate using a proximity head, comprising:
applying a non-Newtonian fluid between the surface of the substrate and a head surface of the proximity head, the non-Newtonian fluid defining a containment wall along one or more sides between the head surface and the surface of the substrate, the one or more sides provided with the non-Newtonian fluid defining a treatment region on the substrate between the head surface and the surface of the substrate, the treatment region containing a plurality of treatment sub-regions;
applying a first Newtonian fluid to the surface of the substrate through the proximity head, such that the applied first Newtonian fluid is substantially contained within a first treatment sub-region in the treatment region defined by the containment wall; and
applying a second Newtonian fluid to the surface of the substrate through the proximity head, such that the applied second Newtonian fluid is substantially contained within a second treatment sub-region in the treatment region defined by the containment wall,
wherein the second Newtonian fluid is substantially different from the first Newtonian fluid, the first treatment sub-region and the second treatment sub-region are separated by the non-Newtonian fluid within the treatment region, the first Newtonian fluid and the second Newtonian fluid aiding in the substantial removal of one or more contaminants from the surface of the substrate.

15. The method for preparing a surface of a substrate using a proximity head of claim 14, wherein the first Newtonian fluid and the second Newtonian fluid are each substantially immiscible with the non-Newtonian fluid contained in the treatment region.

16. A method for preparing a surface of a substrate using a proximity head, comprising:
applying a non-Newtonian fluid between the surface of the substrate and a head surface of the proximity head, the non-Newtonian fluid defining a containment wall along one or more sides between the head surface and the surface of the substrate, the one or more sides of the non-Newtonian fluid defining a treatment region on the substrate between the head surface and the surface of the substrate, the treatment region being substantially isolated from external uncontrolled ambient conditions by the containment wall; and
applying an inert gas to the treatment region such that the inert gas occupies the treatment region displacing existing gas and chemicals, the inert gas application in the treatment region providing one of a substantially low-oxygen or an oxygen-free environment in the treatment region to facilitate additional fabrication.

17. The method for preparing a surface of a substrate using a proximity head of claim 16, wherein additional fabrication includes applying an etching chemistry to etch a feature on the surface of the substrate within the treatment region, or a cleaning chemistry to clean the surface of the substrate within the treatment region.

18. The method for preparing a surface of a substrate using a proximity head of claim 17 further comprising applying an inert gas to the treatment region to substantially displace the etching chemistry or cleaning chemistry from the treatment region so as to provide a substantially oxygen-free environment in a next stage of preparation.

19. The method for preparing a surface of a substrate using a proximity head of claim 16, wherein additional fabrication includes,
applying a metallic material onto the surface of the substrate using one of a electroplating or electroless plating, or
applying a cleaning chemistry to clean the surface of the substrate;
wherein the treatment region provides a substantially clean oxygen free or no-oxygen environment.

20. A method for preparing a surface of a substrate using a proximity head, comprising:
applying a first non-Newtonian fluid between the surface of the substrate and a head surface of the proximity head, the first non-Newtonian fluid defining a containment wall along one or more sides between the head surface and the surface of the substrate, the one or more sides of the first non-Newtonian fluid defining a treatment region on the substrate between the head surface and the surface of the substrate; and
applying a second non-Newtonian fluid to the surface of the substrate through the proximity head, such that the second non-Newtonian fluid is substantially excluded from an area occupied by the first non-Newtonian fluid and substantially maintained within a treatment sub-region in the treatment region due to the containment wall, the second non-Newtonian fluid aiding in the removal of one or more contaminants from the surface of the substrate,
wherein the second non-Newtonian fluid is substantially immiscible with the first non-Newtonian fluid.

21. The method for preparing a surface of a substrate using a proximity head of claim 20, further comprising
applying a third non-Newtonian fluid to the surface of the substrate through the proximity head, such that the third non-Newtonian fluid is substantially excluded from an area occupied by the first non-Newtonian fluid and substantially maintained within a second treatment sub-region in the treatment region that is different from the treatment sub-region of the second non-Newtonian fluid, the third non-Newtonian fluid aiding in the removal of one or more contaminants from the surface of the substrate,
wherein the third non-Newtonian fluid is substantially immiscible with the first non-Newtonian fluid and is different from the first non-Newtonian fluid and second non-Newtonian fluid.

22. The method for preparing a surface of a substrate using a proximity head of claim 20, further comprising
applying a Newtonian fluid to the surface of the substrate through the proximity head, such that the Newtonian fluid is substantially excluded from an area occupied by the first non-Newtonian fluid and substantially maintained within a second treatment sub-region in the treatment region that is different from the treatment sub-region of the second non-Newtonian fluid, the Newtonian fluid aiding in the removal of one or more contaminants from the surface of the substrate,
wherein the Newtonian fluid is substantially immiscible with the first non-Newtonian fluid.

* * * * *